United States Patent
Marui

(10) Patent No.: US 7,348,798 B2
(45) Date of Patent: Mar. 25, 2008

(54) PROGRAMMABLE LOGIC DEVICE, CONFIGURATION APPARATUS, AND CONFIGURATION METHOD

(75) Inventor: Shin'ichi Marui, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 378 days.

(21) Appl. No.: 11/175,408

(22) Filed: Jul. 7, 2005

(65) Prior Publication Data

US 2006/0006904 A1 Jan. 12, 2006

(30) Foreign Application Priority Data

Jul. 9, 2004 (JP) ............... 2004-203955

(51) Int. Cl.
*H01L 25/00* (2006.01)
*H03K 19/177* (2006.01)
*G06F 1/24* (2006.01)
*G06F 9/00* (2006.01)

(52) U.S. Cl. ............... 326/41; 326/38; 716/16; 713/100

(58) Field of Classification Search ............ 326/37–41, 326/47; 716/16

See application file for complete search history.

(56) References Cited

U.S. PATENT DOCUMENTS

| 5,394,031 | A | | 2/1995 | Britton et al. | |
|---|---|---|---|---|---|
| 5,640,106 | A | * | 6/1997 | Erickson et al. | 326/38 |
| 5,737,235 | A | * | 4/1998 | Kean et al. | 716/16 |
| 6,201,406 | B1 | * | 3/2001 | Iwanczuk et al. | 326/38 |
| 6,411,124 | B2 | | 6/2002 | Lee et al. | |
| 6,847,227 | B2 | * | 1/2005 | Goldfinch | 326/38 |

FOREIGN PATENT DOCUMENTS

| GB | 2 300 505 A | 11/1996 |
|---|---|---|
| GB | 2 381 918 A | 5/2003 |

* cited by examiner

*Primary Examiner*—Vibol Tan
*Assistant Examiner*—Dylan White
(74) *Attorney, Agent, or Firm*—McDermott Will & Emery LLP

(57) ABSTRACT

The present invention provides a programmable logic device that is capable of changing the function of only an intended logic element without interfering with other logic elements in operation. Among logic elements (LE0 to LE15), each logic element, of which configuration information should be rewritten, replaces configuration information stored in a configuration storing unit 11 with input configuration information, and output the configuration information stored in the configuration storing unit 11. The function of the intended logic element can be changed by rewriting the configuration information in the intended logic element. Meanwhile, the function of each of other logic elements can remain unchanged by not rewriting the configuration information in the logic element.

21 Claims, 19 Drawing Sheets

"PRIOR ART"

AFTER ONE CLOCK INTERVAL

AFTER TWO CLOCK INTERVALS

AFTER THREE CLOCK INTERVALS

AFTER SIX CLOCK INTERVALS

AFTER SEVEN CLOCK INTERVALS

AFTER EIGHT CLOCK INTERVALS
(END OF CONFIGURATION)

PROGRAMMABLE LOGIC DEVICE, CONFIGURATION APPARATUS, AND CONFIGURATION METHOD

BACKGROUND OF THE INVENTION (1) Field of the Invention

The present invention relates to a programmable logic device, and a configuration apparatus and a configuration method for the programmable logic device. In particular, the present invention relates to a technique to change only the function of the intended logic element without interfering with other logic elements in operation among logic elements of the programmable logic device.

(2) Description of the Related Art

In recent years, programmable logic devices, such as FPGA (Field programmable Gate Array), are widely spread. A programmable logic device is an integrated circuit that includes logic elements. The user can make the programmable logic device perform a desired function by changing the function of each logic element or changing the connection condition among the logic elements. The following describes how to change the function of the programmable logic device, by taking a conventional programmable logic device for instance.

FIG. 1 shows the structure of a conventional programmable logic device. In this example, a programmable logic device 401 includes sixteen logic elements. Each logic element stores a piece of configuration information, which defines the function of the logic element, in a storing unit 41 of each logic element. Each logic element realizes the function according to the stored piece of the configuration information. The user can change the function of each element by rewriting the configuration information.

Each piece of the configuration information is sequentially input from a configuration apparatus 402, and shifted by each storing unit 41 so that the piece of the configuration information is transferred to a targeted logic element (e.g. U.S. Pat. No. 5,394,031).

Meanwhile, in recent years, equipment in which the programmable logic device is incorporated has been downsized. Accordingly, there is a demand for an efficient use of the programmable logic device such that the programmable logic device contributes to the downsizing of the equipment.

To use the programmable logic device as efficiently as possible, it is necessary to map as many processes as possible to each logic element (to improve the spatial efficiency), and to constantly use the logic elements, which is the resources of the programmable logic device (to improve the temporal efficiency). For instance, it is possible to improve the spatial efficiency by allocating a plurality of processes, which are to be performed in parallel, to one programmable logic device. It is also possible to improve the temporal efficiency by allocating a subsequent process to the programmable logic device right after the programmable logic device finishes one of the processes.

To realize such improvement, it is required to provide a programmable logic device in which the function of only an intended logic element can be changed without interfering with other logic elements in operation.

However, in the conventional programmable logic device, all the logic elements have to rewrite and shift the configuration information stored therein to transfer a desired piece of the configuration information to a targeted logic element. Therefore, the functions of all the logic elements are inevitably changed even if the user tries to change the function of only one of the logic elements.

SUMMARY OF THE INVENTION

The object of the present invention is therefore to provide a programmable logic device in which function of only an intended logic element can be changed without interfering with other logic elements in operation, and a configuration apparatus and a configuration method for the programmable logic device.

The programmable logic device according to the present invention is a programmable logic device having one or more logic elements, each logic element comprising: a configuration storing unit operable to store therein configuration information; an internal circuit operable to perform a function that is based on the configuration information stored in the configuration storing unit; a rewrite prohibiting unit operable, if having received a rewrite prohibit instruction, to prohibit replacing of configuration information that has been previously stored in the configuration storing unit with configuration information that is newly input to the logic element; and an output unit operable, if having received a rewrite prohibit instruction, to output the newly input configuration information without change, and operable, if having received a rewrite permit instruction, to output configuration information currently stored in the configuration storing unit.

With the stated structure, after the configuration information is input, the configuration information stored in the configuration storing unit can not be replaced if the rewriting is not permitted.

If the rewriting of the configuration information stored in the logic element which should be rewritten to change the function of the internal circuit is permitted, and the rewriting of the configuration information stored in the logic element in operation is not permitted, the function of the logic element can be changed by the rewriting, while the function of the logic element in operation can not be changed.

Accordingly, it becomes possible to change the function of only the intended logic element even if some of the other logic elements are in operation.

Furthermore, if the rewriting is not permitted, the logic element outputs the input configuration information, and if the rewriting is permitted, the logic element outputs the configuration information stored in the configuration storing unit thereof. In any case, either of the configuration information is output. Therefore, the configuration information is transferred among the plurality of the logic elements. This is applicable regardless of the connection condition among the logic elements (e.g. a cascade connection, a connection with a tree structure, a connection with a network structure, and so on).

Here, the output unit may include a multiplexer having a first input terminal, a second input terminal, a control terminal and an output terminal. The first input terminal may receive the configuration information currently stored in the configuration storing unit. The second input terminal may receive the newly input configuration information. The control terminal may receive rewrite information that represents either the rewrite prohibit instruction or the rewrite permit instruction. The output terminal may output the configuration information input to the first input terminal if the rewrite information represents the rewrite permit instruction, and output the configuration information input to the second input terminal if the rewrite information represents the rewrite prohibit instruction.

With the stated structure, each logic element has a bypass circuit that bypasses the configuration storing unit of each logic element. The multiplexer outputs the configuration information via the bypass circuit if the rewrite information represents the rewrite prohibit instruction. Accordingly, each logic element can output the input configuration information as it is.

Here, the programmable logic device may have a plurality of the logic elements, and all or some of the plurality of the logic elements may be connected together by a cascade connection for distributing the configuration information.

With the stated structure, the cost of wiring can be reduced compared with the structure in which each logic element is individually connected to an external configuration apparatus. This effect can be gained if at least some of the logic elements are connected by the cascade connection. The maximum effect can be gained in the case that all the logic elements are connected by the cascade connection.

Here, the programmable logic device may further comprise an output terminal, wherein the output unit of a logic element at a last stage of the cascade connection, which is included in the plurality of the logic elements, may output the configuration information to outside the programmable logic device via the output terminal.

With the stated structure, the programmable logic device can output the predetermined bit pattern that is input prior to the configuration information. Accordingly, the configuration can be performed using a configuration apparatus that stops the input of the configuration information based on that the predetermined bit pattern is output. As described later, such a configuration apparatus has an advantage that the processing load is light. Therefore, the processing load of the whole system can be reduced by the combination of the programmable logic device with the above-described structure and the configuration apparatus.

Here, the programmable logic device may further comprise a rewrite information storing unit operable to store therein rewrite information that represents either the rewrite prohibit instruction or the rewrite permit instruction, wherein each of the rewrite prohibiting unit and the output unit receives the rewrite information.

With the stated structure, the rewrite information is stored in the logic element. Therefore, once an external configuration apparatus input the configuration information, the configuration apparatus is not required to continuously input the configuration information.

Here, all or some of the plurality of the logic elements may be connected together by a cascade connection for distributing the configuration information.

With the stated structure, the cost of wiring can be reduced compared with the structure in which each logic element is individually connected to an external configuration apparatus. This effect can be gained if at least some of the logic elements are connected by the cascade connection, and the maximum effect can be gained in the logic elements are connected by the cascade connection.

Here, the rewrite prohibiting unit may prohibit, even if having received the rewrite permit instruction, rewriting of the configuration information that has been previously stored in the configuration storing unit while the rewrite information is being distributed.

With the stated structure, the configuration information stored in the configuration storing unit is not rewritten while the rewrite information is being transferred. This prevents the configuration information from being unexpectedly rewritten while the rewrite information is being transferred.

The programmable logic device according to the present invention is A programmable logic device having one or more logic elements, each logic element comprising: a first storing unit operable to store therein first configuration information; a second storing unit operable to store therein second configuration information; an internal circuit operable to perform a function that is based on the first configuration information stored in the first storing unit or the second configuration information stored in the second configuration unit; a selecting unit operable to select whichever of the first storing unit and the second storing unit stores configuration information that should define the function of the internal circuit; and a rewriting unit operable to rewrite the configuration information stored in whichever of the first storing unit and the second storing unit is not selected by the selecting unit.

With the stated structure, each logic element can select the first configuration information as the configuration information that defines the function of the internal circuit, and the second configuration can be rewritten while the first configuration information is being selected.

If the first and the second configuration storing units store the same configuration information, the configuration information given to the internal circuit before and after the selection becomes the same. The function of such a logic element will not be changed. Meanwhile, if the configuration information before and after the selection is deferent, it means that the function of the logic element is changed. As described above, with the stated structure, the function of only an intended logic element can be changed without interfering with other logic elements in operation.

Here, the programmable logic device may have a plurality of logic elements. All or some of the first storing units of the respective logic elements may be connected together by a cascade connection for distributing the first configuration information. All or some of the second storing units of the respective logic elements may be connected together by a cascade connection for distributing the second configuration information.

With the stated structure, the cost of wiring can be reduced compared with the connection condition in which the first storing unit and the second storing unit are individually connected to an external configuration apparatus. This effect can be gained if at least some of the logic elements are connected by the cascade connection. The maximum effect can be gained in the case that all the logic elements are connected by the cascade connection.

The programmable logic device according to the present invention is a programmable logic device having one or more logic elements, each logic element comprising: a main storing unit operable to store therein first configuration information; an internal circuit operable to perform a function that is based on the first configuration information stored in the main storing unit; a preparatory storing unit operable to store therein second configuration information that is to be transferred to and stored in the main storing unit; a main rewriting unit operable, if having received a rewrite permit instruction, to replace the first configuration information stored in the main storing unit with the second configuration information stored in the preparatory configuration information; and a preparatory rewriting unit operable, if having received a rewrite prohibit instruction, to rewrite the second configuration information stored in the preparatory storing unit.

With the stated structure, the configuration information stored in the main storing unit in each logic element is rewritten when the logic element receives the rewrite permit instruction. Here, if the main storing unit and the preparatory storing unit store the same configuration information, the function of the logic element will not be changed, and if the main storing unit and the preparatory storing unit store different configuration information, the function of the logic element will be changed.

If the function of the internal circuit should be changed, different configuration information is to be stored in the preparatory storing unit and the main storing unit of the logic device, and the same configuration information is to be stored in the preparatory storing unit and the main storing unit in the logic element in operation. Accordingly, regarding the logic element including the internal circuit whose function should be changed, the configuration information stored in the logic element will be rewritten. Meanwhile, the configuration information stored in the logic element in operation will not be changed after the rewriting.

Accordingly, the function of only an intended logic element can be changed without interfering with other logic elements in operation.

Here, the programmable logic device may have a plurality of the logic elements, and the preparatory storing units of the respective logic elements may be connected together by a cascade connection for distributing the configuration information.

With the stated structure, the cost of wiring can be reduced compared with the structure in which each preparatory storing unit is individually connected to an external configuration apparatus. This effect can be gained if at least some of the logic elements are connected by the cascade connection. The maximum effect can be gained in the case that all the logic elements are connected by the cascade connection.

The configuration apparatus according to the present invention is a configuration apparatus that configures a programmable logic device having a plurality of logic elements, each logic element having a same structure including a configuration storing unit, and the configuration apparatus comprising: a providing unit operable to provide each logic element with a piece of rewrite information which represents either a rewrite permit instruction for permitting rewriting of configuration information or a rewrite prohibit instruction for prohibiting the rewriting; and a configuration information input unit operable to input, to the programmable logic device, a piece of configuration information in correspondence with a logic element included in the plurality of the logic elements to which the piece of the rewrite information that represents the rewrite permit instruction is provided by the providing unit.

With the stated structure, the configuration apparatus inputs the configuration information after instructing each logic element whether to rewrite the configuration information. If the rewrite prohibit instruction is given to each logic element in operation, the function of only an intended logic device can be changed without interfering with other logic element in operation among the logic elements.

Here, the plurality of the logic elements may be connected together by a cascade connection for distributing the configuration information, and the configuration information input unit may arrange pieces of the configuration information in accordance with an order of the logic elements, and sequentially input the pieces of the configuration information to a logic element at a first stage of the cascade connection, which is included in the plurality of the logic elements.

With the stated structure, the cost of wiring can be reduced compared with the structure in which each configuration storing unit is individually connected to the configuration apparatus. This effect can be gained if at least some of the configuration storing units are connected by the cascade connection, and the maximum effect can be gained in the case that all the configuration storing units are connected by the cascade connection.

Here, a logic element at a last stage of the cascade connection, which is included in the plurality of the logic elements, may output the configuration information to outside the programmable logic device, and the configuration apparatus may further comprise: a predetermined pattern input unit operable to input a predetermined bit pattern to the logic element at the first stage of the cascade connection before the configuration information input unit inputs the configuration information; and a stop unit operable to stop the configuration information input unit after the predetermined bit pattern is output from the logic element at the last stage of the cascade connection.

With the stated structure, to stop the input, the configuration apparatus needs to detect only the predetermined bit pattern. Such a specification can reduce the processing load compared with other specifications, such as the case where the number of the pieces of the configuration information is counted, and the input is stopped when the number reaches a predetermined value.

The configuration apparatus according to the present invention is a configuration apparatus that configures a programmable logic device having a plurality of logic elements, each logic element having a same structure including a first storing unit find a second storing unit, and the configuration apparatus comprising: a first input unit operable to input pieces of first configuration information in one-to-one correspondence with the logic elements to the first storing units of the respective logic elements; a second input unit operable to input pieces of second configuration information in one-to-one correspondence with the logic elements into the second storing units of the respective logic elements; and a providing unit operable to provide each logic element with a control signal that indicates which between the first configuration information and the second configuration information should be selected.

With the stated structure, each logic element selects the first configuration information as the configuration information that defines the function of the internal circuit, and the configuration apparatus can rewrite the second configuration information while the first information is being selected. After that, the configuration apparatus can rewrite the first configuration information while the second configuration information is being selected by the logic element.

Accordingly, the function of only an intended logic element can be changed without interfering with other logic elements in operation.

Here, the plurality of the logic elements may be connected together by a cascade connection for distributing the first configuration information and the second configuration information. The first input unit may arrange pieces of the first configuration information in accordance with an order of the logic elements, and sequentially inputs the pieces of the first configuration information to a logic element at a first stage of the cascade connection, which is included in the plurality of the logic elements. The second input unit may arrange pieces of the second configuration information in accordance with an order of the logic elements, and sequentially inputs the pieces of the second configuration information to the logic element at the first stage of the cascade connection.

With the stated structure, the cost of wiring can be reduced compared with the structure in which the configuration apparatus is connected to each first storing unit and each second storing unit individually.

The configuration apparatus according to the present invention is a configuration apparatus that configures a programmable logic device having a plurality of logic elements, each logic element having a same structure including a preparatory storing unit and a main storing unit, and the configuration apparatus comprising: an input unit operable to input pieces of first configuration information that are in one-to-one correspondence with the logic elements and are to be transferred to and stored in the main storing units of the respective logic elements; and a providing unit operable to provide each logic element with a control signal indicating that the first configuration information stored in the main storing unit should be replaced by second configuration information stored in the preparatory storing unit.

With the stated structure, the configuration information stored in the main storing unit in each logic element is rewritten when the logic element receives an instruction to rewrite from the configuration apparatus. Here, if the main storing unit and the preparatory storing unit store the same configuration information, the function of the logic element will not be changed, and if the main storing unit and the preparatory storing unit store different configuration information, the function of the logic element will be changed.

Accordingly, the function of only an intended logic element can be changed without interfering with other logic elements in operation.

Here, the plurality of the logic elements may be connected together by a cascade connection for distributing the configuration information, and the input unit may arrange the pieces of the configuration information in accordance with an order of the logic elements, and sequentially input the pieces of the configuration information to a logic element at a first stage of the cascade connection, which is included in the plurality of the logic elements.

With the stated structure, the cost of wiring can be reduced compared with the structure in which the configuration apparatus is connected to each preparatory storing unit individually.

The configuration method according to the present invention is a configuration method for configuring a programmable logic device having a plurality of logic elements, each logic element having a same structure including a configuration storing unit, and the configuration method comprising: a providing step of providing each logic element with a rewrite permit instruction for permitting rewriting of configuration information or a rewrite prohibit instruction for prohibiting the rewriting; and an input step of inputting, to the programmable logic device, a piece of the configuration information in correspondence with a logic element included in the plurality of the logic elements to which the rewrite permit instruction is provided by the providing step.

With the stated structure, the same effect as the above-described configuration apparatus can be gained.

The configuration method according to the present invention is a configuration method for configuring a programmable logic device hating a plurality of logic elements, each logic element having a same structure including a first storing unit and a second storing unit, and the configuration method comprising: a first input step of inputting pieces of first configuration information in one-to-one correspondence with the logic elements into the first storing units of the respective logic elements; a providing step of providing each logic element with a control signal indicating that the first configuration information stored in the first storing unit of each logic element should be selected; and a second input step of inputting pieces of second configuration information in one-to-one correspondence with the logic elements into the second storing units of the respective logic elements while the first configuration information is being selected in accordance with the providing step.

With the stated structure, the same effect as the above-described configuration apparatus can be gained.

The configuration method according to the present invention is a configuration method for configuring a programmable logic device having a plurality of logic elements, each logic element having a same structure including a preparatory storing unit and a main storing unit, and the configuration method comprising: an input step of inputting pieces of first configuration information that are in one-to-one correspondence with the logic elements and are to be transferred to and stored in the main storing units of the respective logic elements; and a providing step of providing each logic element with a control signal indicating that the first configuration information stored in the main storing unit should be replaced by the second configuration information stored in the preparatory storing unit.

With the stated structure, the same effect as the above-described configuration apparatus can be gained.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the Drawings.

DESCRIPTION OF THE PREFERRED EMBODIMENTS

The First Embodiment

Structure

Figure 1:
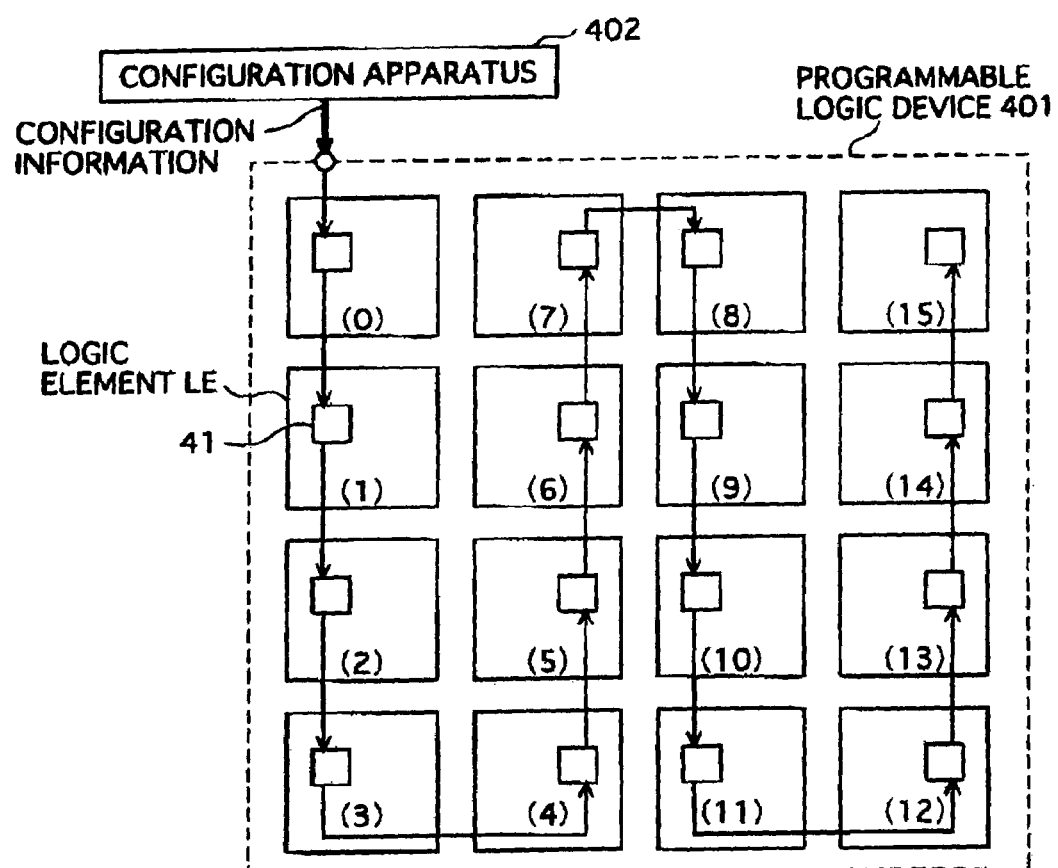
FIG. 1 shows a structure of a conventional programmable logic device.
Figure 2:
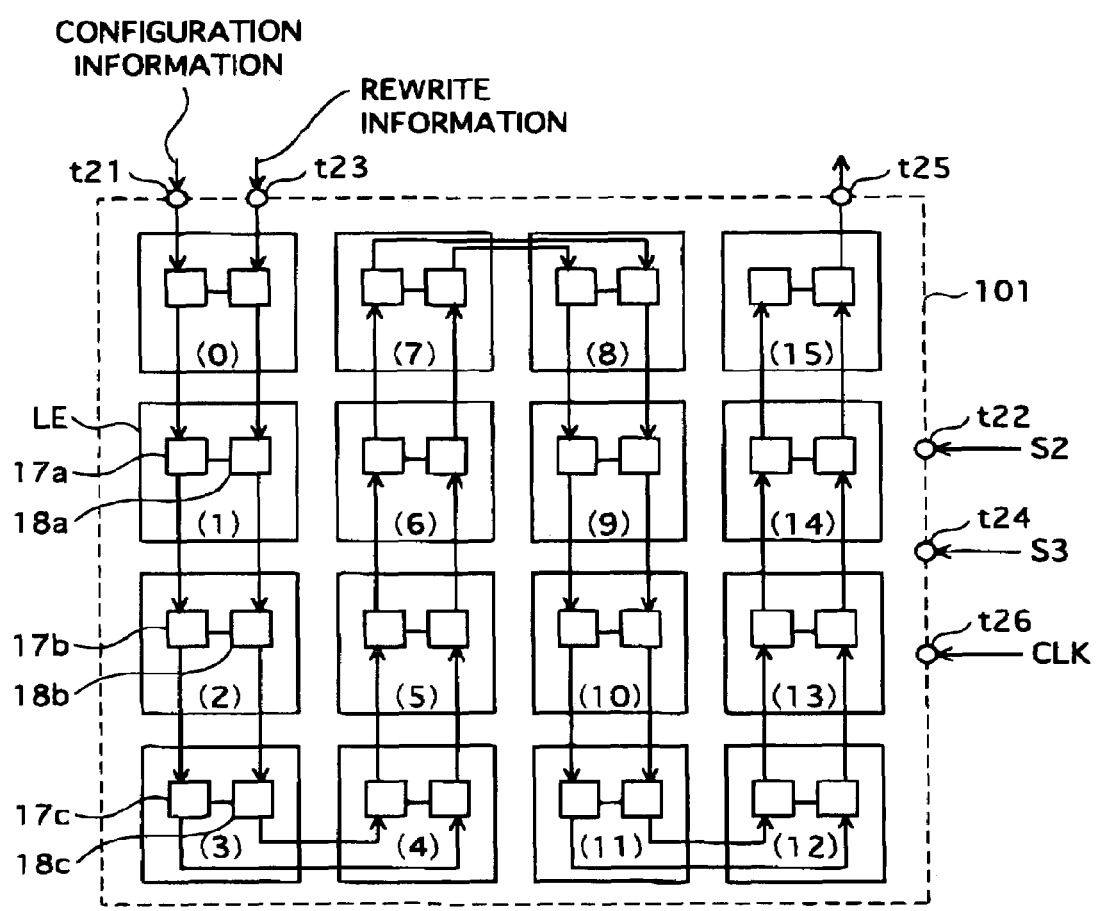
FIG. 2 shows a structure of a programmable logic device according to the first embodiment.

FIG. 2 shows a structure of a programmable logic device according to the first embodiment.

A programmable logic device 101 includes sixteen logic elements (LE0-LE15). Each logic element includes a unit cell 17 and a unit cell 18. Each unit cell 17 includes a configuration storing unit 11, and each unit cell 18 includes a rewrite information storing unit 14. The configuration storing unit 11 stores a piece of configuration information that defines a function of the logic element. The rewrite information storing unit 14 stores a piece of rewrite information that indicates whether the piece of the configuration information stored in the configuration storing unit 11 should be rewritten or not.

The configuration storing units are connected to each other by a cascade connection and structure a shift register. The rewrite information storing units are also connected to each other by a cascade connection and structure a shift register.

The first embodiment is characterized by that when the piece of the rewrite information, which is given to each logic element, represents a rewrite permit instruction, the configuration information stored in the configuration unit 11 is to be rewritten, and when the piece of the rewrite information represents a rewrite prohibit instruction, the configuration information is not to be rewritten.

In this embodiment, the piece of rewrite information that represents the rewrite permit instruction is given to each logic element whose function should be changed, and the piece of rewrite information that represents the rewrite prohibit instruction is given to each logic element in operation. Accordingly, the user can change the function of each logic element whose function should be changed by rewriting the configuration information given to the logic element. Meanwhile, the function of each logic element in operation will not be change, because the piece of the configuration information given to the logic element in operation will not be changed.

Here, it does not matter which of the rewrite prohibit instruction and the rewrite permit instruction is given to a logic element that is neither the logic element whose function should be changed nor the logic element in operation. However, it is preferable that the rewrite prohibit instruction is given to such a logic element, because this saves time performing unnecessary rewriting of the configuration information and realizes a high-speed configuration.

The user can change the functions of only intended logic elements without interfering with other logic elements in operation.

Here, the piece of the rewrite information that is to be given to each logic element is sequentially input from a terminal t23, and distributed to the rewrite information storing unit 14 of each logic element.

In addition, control signals S2 and S3, and a clock signal CLK are given to the programmable logic device respectively via terminals t22, t24, and t26. The logic element at the last stage (LE15) outputs the configuration information via a terminal t25.

Figure 3:
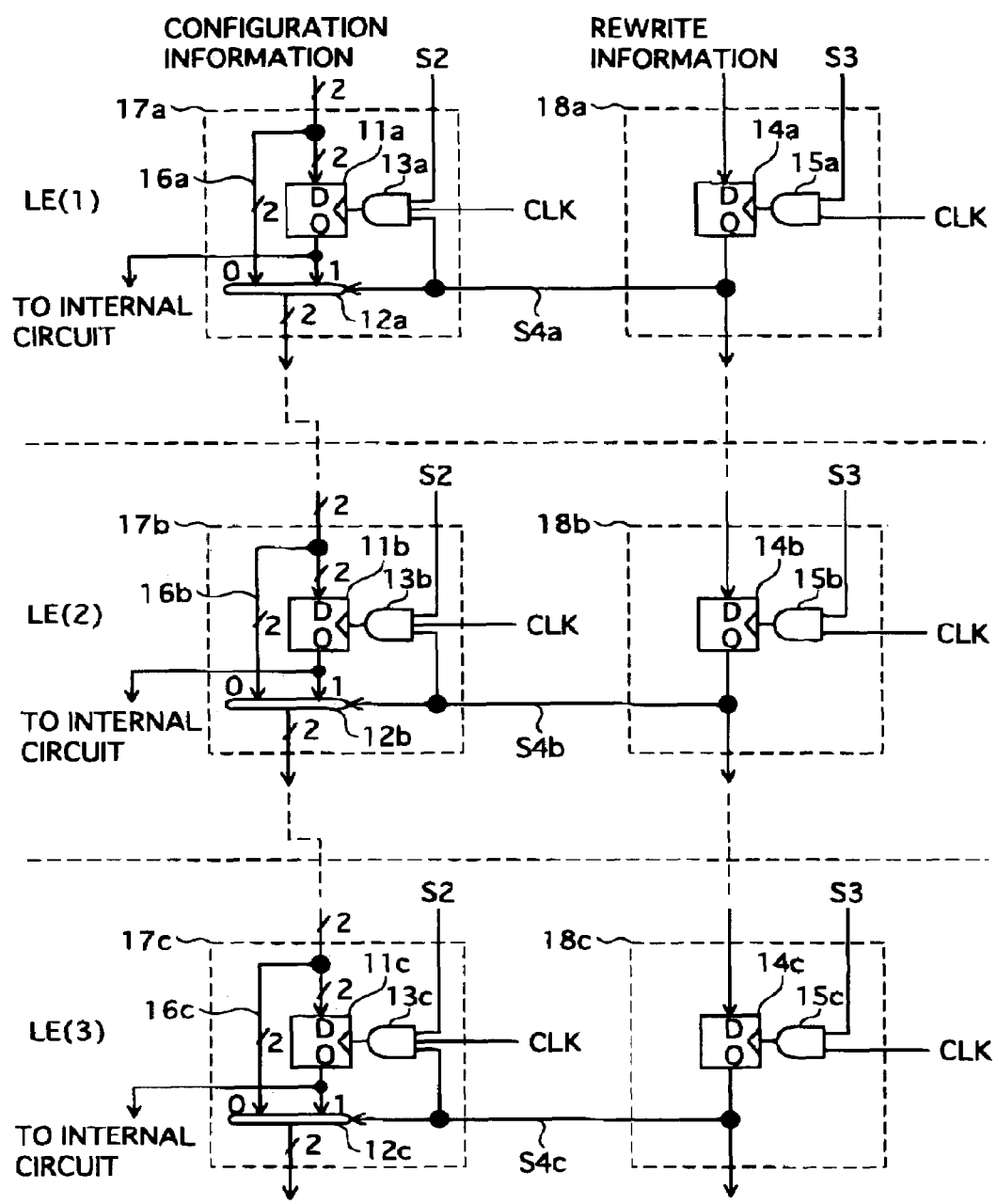
FIG. 3 shows structures of logic elements according to the first embodiment.

FIG. 3 shows the structure of the logic element according to the first embodiment.

In FIG. 3, only three logic elements (LE1, LE2 and LE3) out of the sixteen logic elements are illustrated. Each logic element has the same structure. Therefore, only the logic element LE2 is described next.

The logic element LE2 includes a configuration storing unit 11b, a multiplexer 12b, an AND element 13b, a rewrite information storing unit 14b, an AND element 15b, a bypass circuit 16b, and an internal circuit.

The configuration storing unit 11b and the rewrite information storing unit 14b are respectively structured by D flip-flops. Here, assume that each piece of the configuration information is 2-bit information, and each piece of the rewrite information is 1-bit information.

An output terminal Q of the configuration storing unit 11b is connected to the internal circuit and the multiplexer 12b.

The internal circuit realizes a function based on a piece of the configuration information given to the internal circuit from the output terminal Q. For instance, if the piece of the configuration information represents a value "01", the internal circuit operates as an adder, and if the piece of the configuration information represents a value "10", it operates as a multiplier.

The multiplexer 12b includes a first input terminal, a second input terminal, an output terminal, and a control terminal. The first input terminal is connected to the output terminal Q of the configuration storing unit 11b, and the second input terminal is connected to the bypass circuit 16b. The output terminal is connected to the input terminal D of the configuration storing unit 11c included in the logic element LE3, which is next to the logic element LE2. The rewrite information S4b is input from the control terminal. The rewiring information S4b is a signal indicating whether the configuration information should be rewritten.

If the rewrite information S4b represents a value "1", which means that the configuration information should be rewritten, the output terminal outputs the configuration information input from the first input terminal. If the rewrite information S4b represents a value "0", which means that the configuration information should not be rewritten, the output terminal outputs the configuration information input from the second input terminal.

The AND element 13b performs a logical multiplication on the control signal S2, the clock signal CLK and the rewrite information S4b, and outputs the result of the logical multiplication to the clock terminal of the configuration storing unit 11b.

The output terminal Q of the rewrite information storing unit 14b is connected to the control terminal of the multiplexer 12b and the input terminal of the AND element 13b, and also connected to the input terminal D of the rewrite information storing unit 14c included in the logic element LE3, which is next to the logic element LE2.

The AND element 15b performs a logical multiplication on the control signal S3 and the clock signal CLK, and outputs the result of the logical multiplication to the clock terminal of the rewrite information storing unit 14b.

Figure 4:
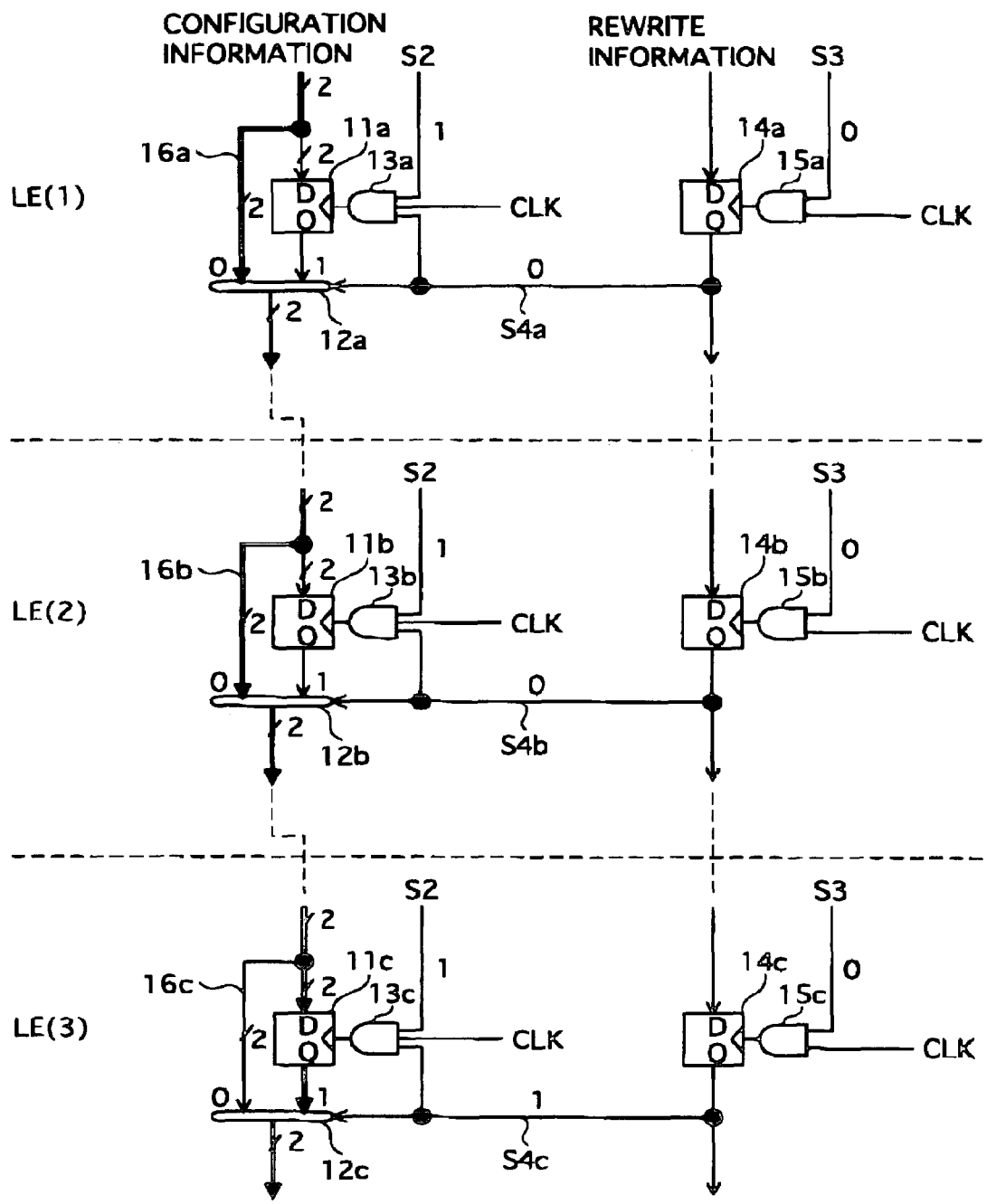
FIG. 4 shows an example operation of a logic element.

FIG. 4 shows an example operation of the logic element.

Assume that the rewrite information storing units 14a 14b and 14c prestore pieces of rewrite information representing values "0", "0" and "1" respectively. The control signal S2 represents a value "1".

Firstly, the operation performed by the logic element LE1 is described next. Since the rewrite information S4a represents a value "0", the AND element 13a always outputs a value "0", and never outputs the clock signal CLK, even if the control signal S2 represents a value "1". In other words, the AND element 13a prohibits the configuration storing unit 11a to rewrite the contents thereof. Therefore, the piece of the configuration information stored in the configuration storing unit 11a is never to be rewritten.

The multiplexer 12a selects the second input terminal, because the rewrite information S4a represents a value "0". Accordingly, the configuration information input to the logic element LE1 passes through the bypass circuit 16a, and is output to the logic element LE2, which is next to the logic element LE1.

Secondly, regarding the operation performed by the logic element LE2, the logic element LE2 performs in the same manner as the logic element LE1, because the rewrite information S4b represents a value "0".

Finally, the operation performed by the logic element LE3 is described next. Since the rewrite information S4c represents a value "1" and the control signal S2 represents a value "1", the AND element 13c outputs the clock signal CLK. In other words, the AND element 13c causes the configuration storing unit 11c to rewrite the configuration information.

The multiplexer 12c selects the first input terminal, because the rewrite information S4c represents a value "1". Accordingly, the configuration information input to the logic element LE3 is firstly stored in the configuration storing unit 11c, and output to the logic element LE4, which is next to the logic element LE3.

The rewrite information storing units 14a, 14b and 14c prestore pieces of rewrite information representing values "0", "0" and "1" respectively. How to set these values is described next.

For setting the rewrite information, a value "1" is set to the control signal S3, and a value "0" is set to the control signal S2.

If the control signal S3 represents a value "1", each of the AND elements 15a, 15b and 15c outputs the clock signal CLK. Therefore, each of the rewrite information storing units 14a, 14b and 14c works as a shift register. The pieces of the rewrite information to be stored by the respective logic elements are sequentially input according to the order of the logic elements LE15 to LE0. As a result, each piece of the rewrite information is sequentially transferred to the next logic element at each clock interval, and distributed to all the logic elements after sixteen clock intervals. At this point of time, a value "0" is set to the control signal S3. Then, the shifting operation stops. This is the way in which the rewrite information is set.

Figure 5:
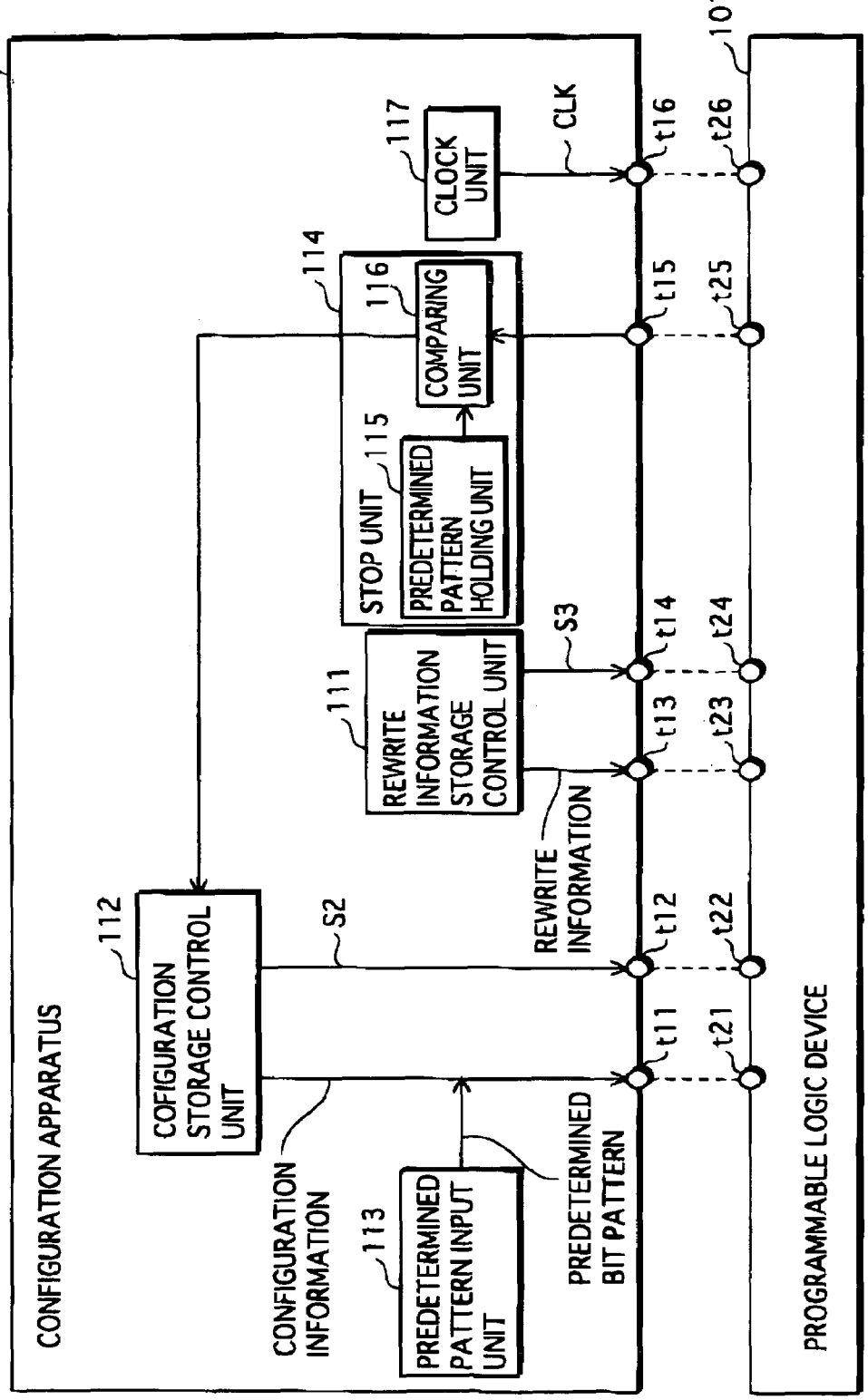
FIG. 5 shows a structure of a configuration apparatus according to the first embodiment.

FIG. 5 shows the structure of a configuration apparatus, A configuration apparatus 102 is used for configuring the programmable logic device 101. The configuration apparatus 102 includes a rewrite information storage control unit 111, a configuration storage control unit 112, a predetermined pattern input unit 113, a stop unit 114, and a clock unit 117.

The rewrite information storage control unit 111 causes the rewrite information storing unit 14 of each logic element included in the programmable logic device 101 to store the corresponding piece of the rewrite information. More specifically, after changing the value of the control signal S3 from "0" to "1", the rewrite information storage control unit 111 sequentially inputs, at every clock interval, pieces of the rewrite information respectively corresponding to the logic elements from LE15 to LE0 to the programmable logic device 101. Then, after sixteen clock intervals, the rewrite information storage control unit 111 changes the value of the control signal S3 from "1" to "0".

The configuration storage control unit 112 causes the logic element that stores the rewrite information representing a value "1" to store the configuration information. More specifically, after the rewrite information storage control unit 111 finishes the input of the rewrite information, the configuration storage control unit 112 changes the value of the control signal from "0" to "1", and sequentially outputs, at every clock interval, pieces of the configuration information to the programmable logic device 101. The pieces of the configuration information respectively correspond to the logic elements that store the rewrite information representing a value "1". After that, the configuration storage control unit 112 stops the input of the configuration information in accordance with a stop signal output from the stop unit 114.

The predetermined pattern input unit 113 inputs a predetermined 2-bit pattern prior to the configuration storage control unit 112 inputting the configuration information.

The stop unit 114 monitors the configuration information output by the logic element LE15, and outputs the stop signal to the configuration storage control unit 112 when the stop unit monitors the predetermined bit pattern. For realizing such a function, the stop unit 114 includes a predetermined pattern holding unit 115 that holds the predetermined bit pattern, and a comparing unit 116 that compares the predetermined bit pattern and the output by the logical element LE15 and outputs the stop signal if they are identical.

The clock unit 117 provides the programmable logic device 101 and each functional unit of the configuration apparatus 102 with the clock signal CLK.

Example Operations

The following describes example operations of the programmable logic device 101 according to the first embodiment in the case where the function of a intended logic element is changed while some of the other logic elements are in operation.

Figure 6:
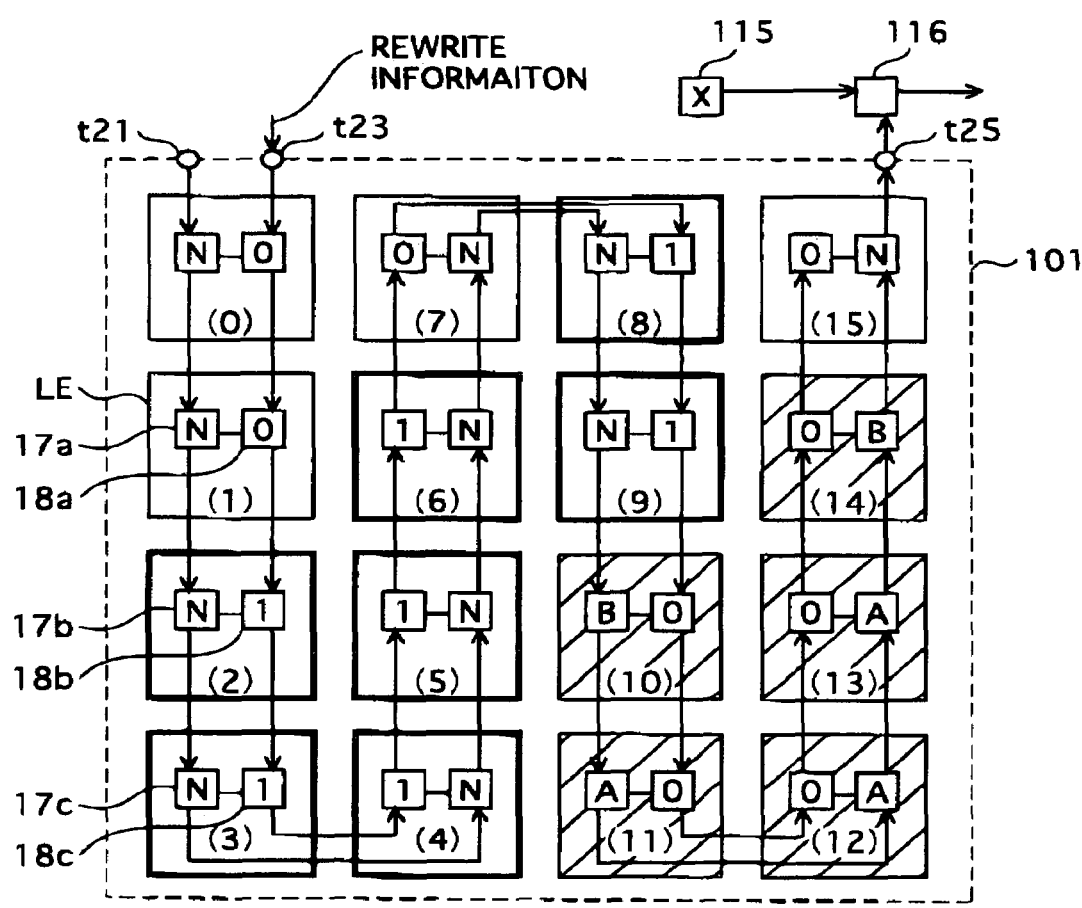
FIG. 6 shows a situation where all logic elements store rewrite information.

FIG. 6 shows the case where every logic element stores the rewrite information.

In FIG. 6, assume that the logic elements LE14, LE13, LE12, LE11 and LE10 are in operation, and the functions of the logic elements LE9, LE8, LE6, LE5, LE4, LE3 and LE2 are desired to be changed.

Note that the pieces of the configuration information are represented by the signs "A", "E" and "N", which respectively mean a function 1, a function 2, and an NOP (No Operation). The predetermined bit pattern is represented by "X".

Firstly, the configuration apparatus 102 sequentially outputs the pieces of the rewrite information, which are to be respectively stored in the logic elements LE15 to LE0, in accordance with the order of the logic elements. Here, a value "1" is set to each piece of the rewrite information for the logic elements whose functions should be changed, and a value "0" is set to each piece of the rewrite information for the other logic elements. The programmable logic device 101 sequentially transfers and distributes the pieces of the rewrite information to the logic elements.

Accordingly, as FIG. 6 shows, a piece of the rewrite information representing a value "1", is stored in each logic element whose function should be changed, and a piece of the rewrite information representing "0" is stored in each of the other logic elements.

Figure 7:
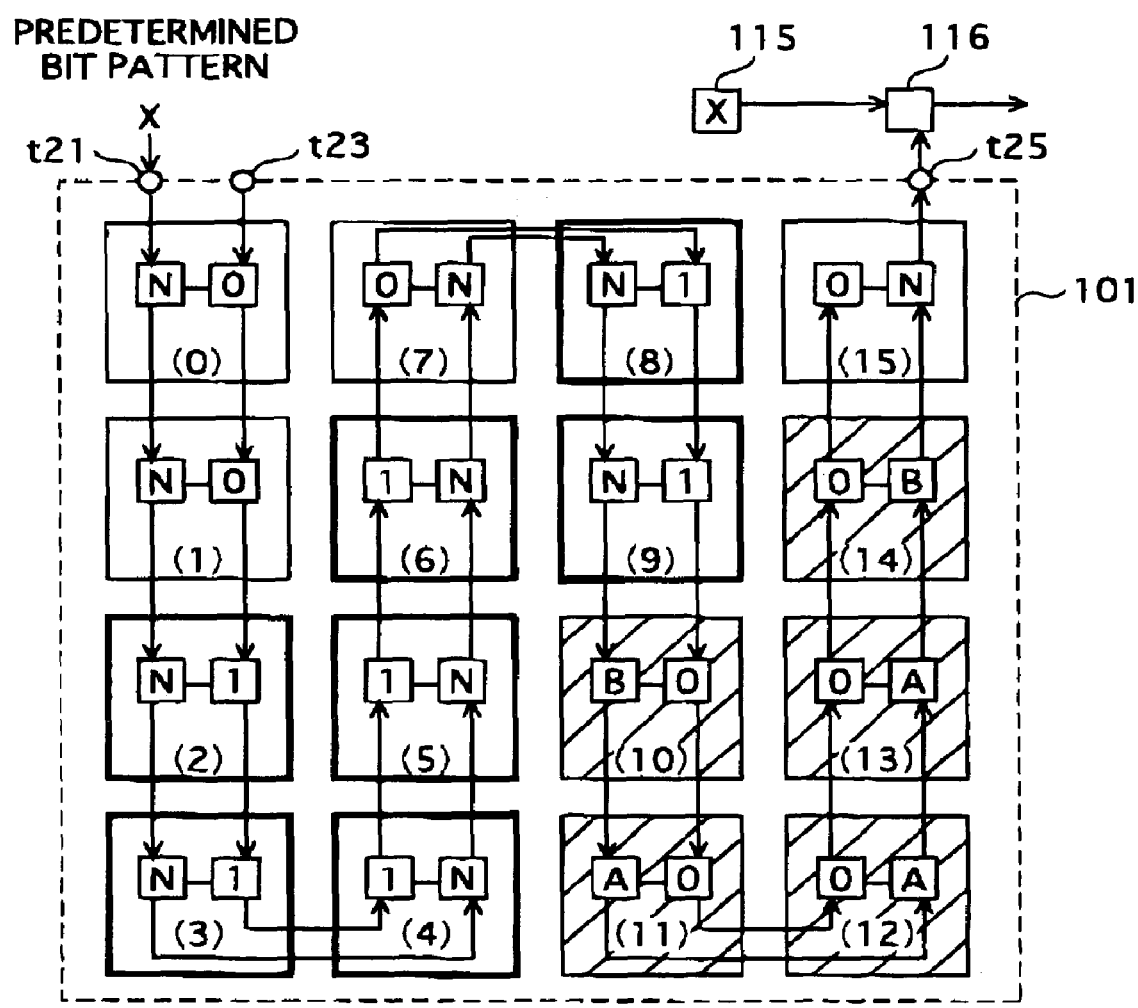
FIG. 7 shows a situation in which a predetermined bit pattern is input to a programmable logic device prior to configuration information.

FIG. 7 shows a situation in which the predetermined bit pattern is input prior to the configuration information.

FIG. 7 shows that the predetermined bit pattern "X" has passed through the logic elements LE0 and LE3, and has reached the input terminal D of the configuration storing unit 11 included in the logic element LE2.

Figure 8:
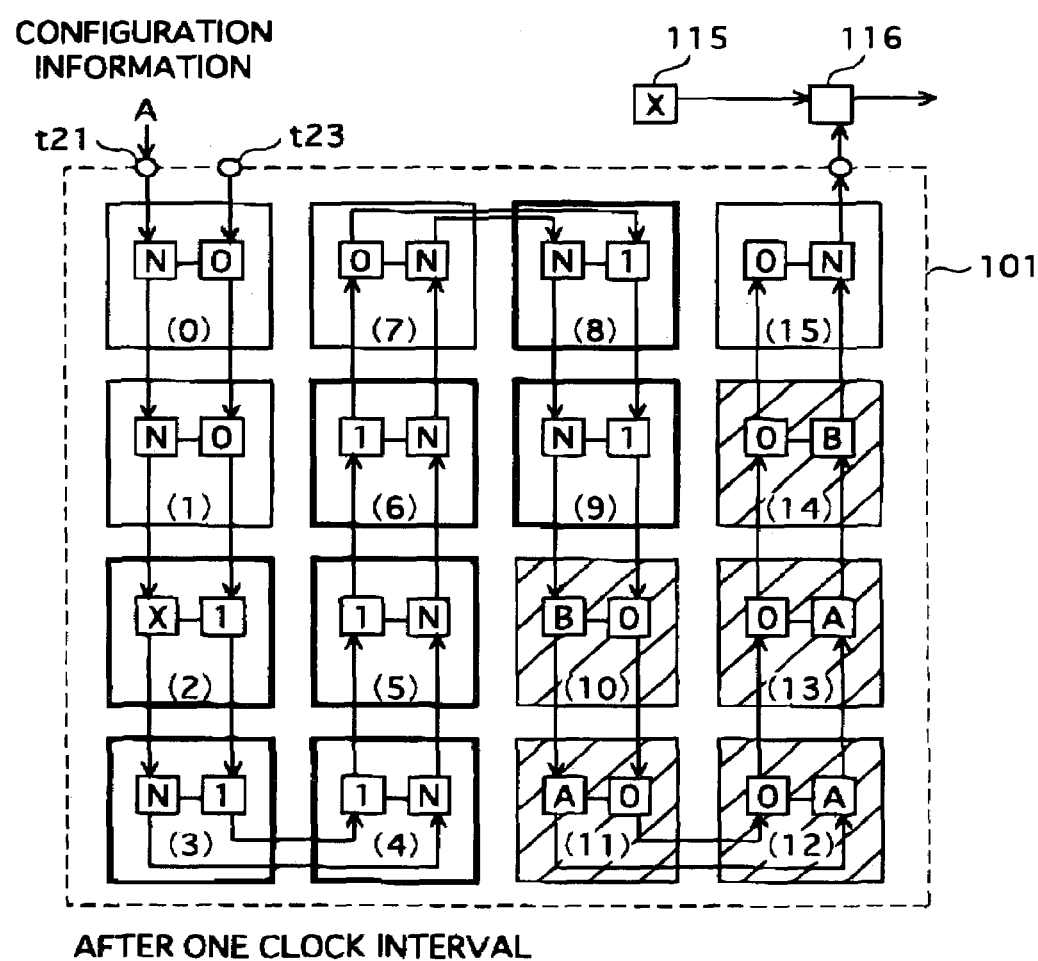
FIG. 8 shows a status of a programmable logic device after one clock interval.

FIG. 8 shows the status of the programmable logic device 101 after one clock interval.

After one clock interval, the configuration storing unit 11 included in the logic element LE2 replaces the contents stored therein with the predetermined bit pattern "X" input from the input terminal D. At the same time, the configuration information "A", which should be stored in the logic element LE9, is input to the programmable logic device 101. At this point of time, the configuration information "A" has passed through the logic elements LE0 and LE1, and has reached the input terminal D of the configuration storing unit 11 included in the logic element LE2.

Figure 9:
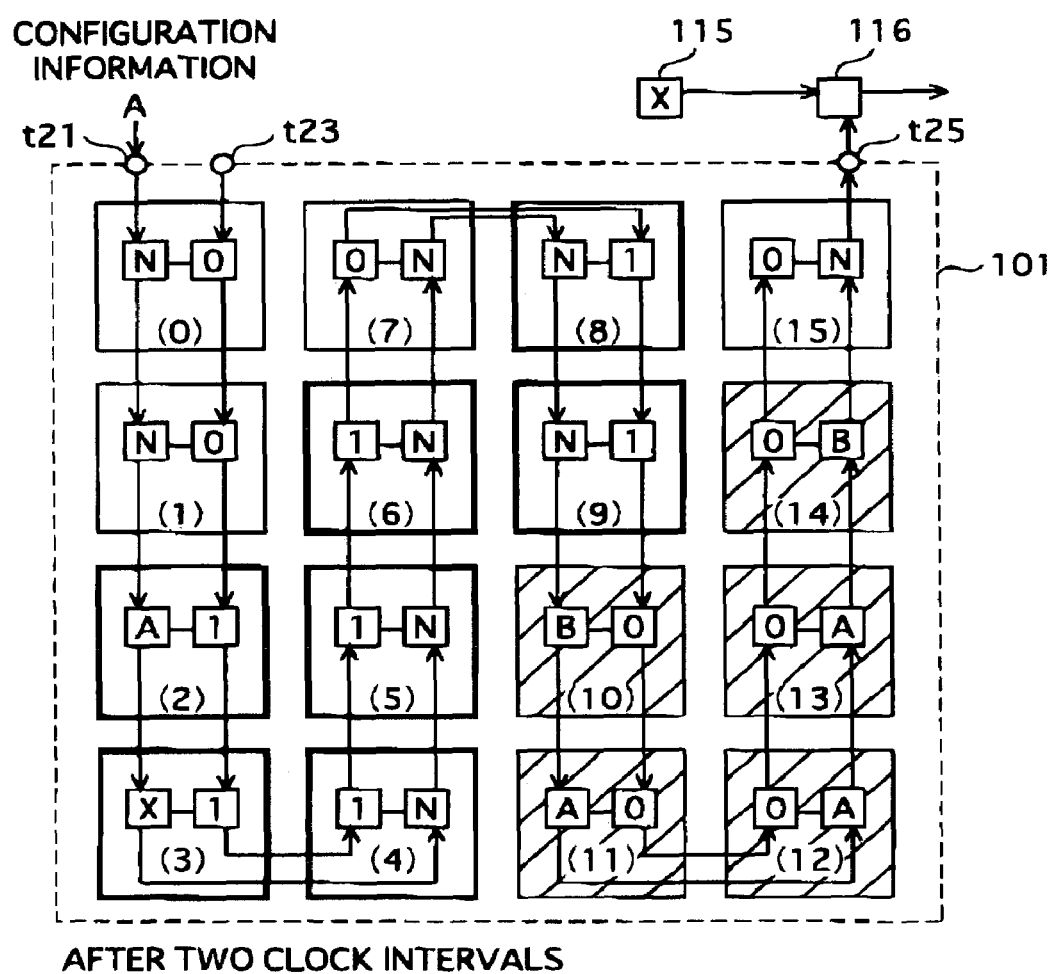
FIG. 9 shows a status of a programmable logic device after two clock intervals.

FIG. 9 shows the status of the programmable logic device 101 after two clock intervals.

After two clock intervals, the logic element LE3 stores the predetermined bit pattern "X", and at the same time, the logic element LE2 stores the configuration information "A".

Figure 10:
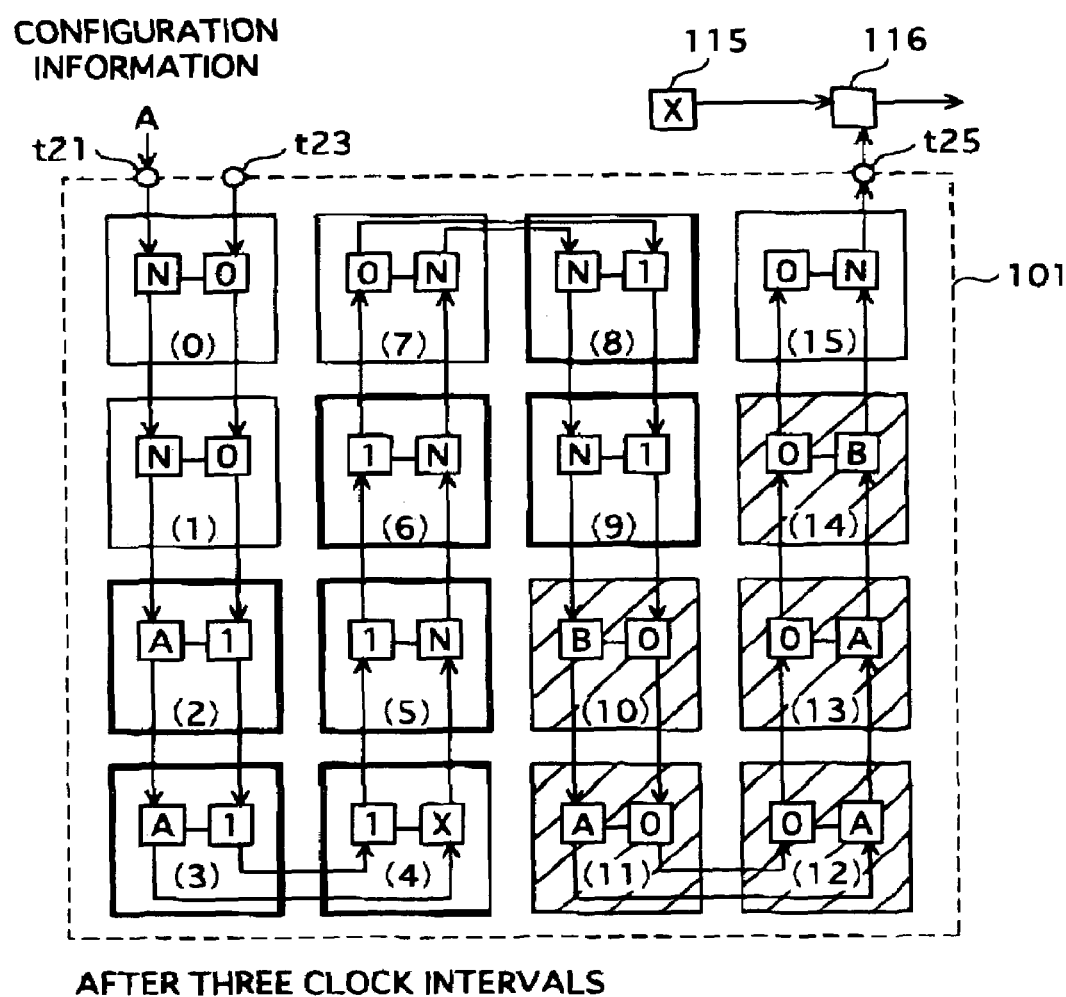
FIG. 10 shows a status of a programmable logic device after three clock intervals.

FIG. 10 shows the status of the programmable logic device 101 after three clock intervals.

After three clock intervals, the logic element LE4 stores the predetermined bit pattern "X", the logic element LE3 stores the configuration information "A", and the logic element LE2 stores the configuration "A".

After that, the pieces of the configuration information are input sequentially.

Figure 11:
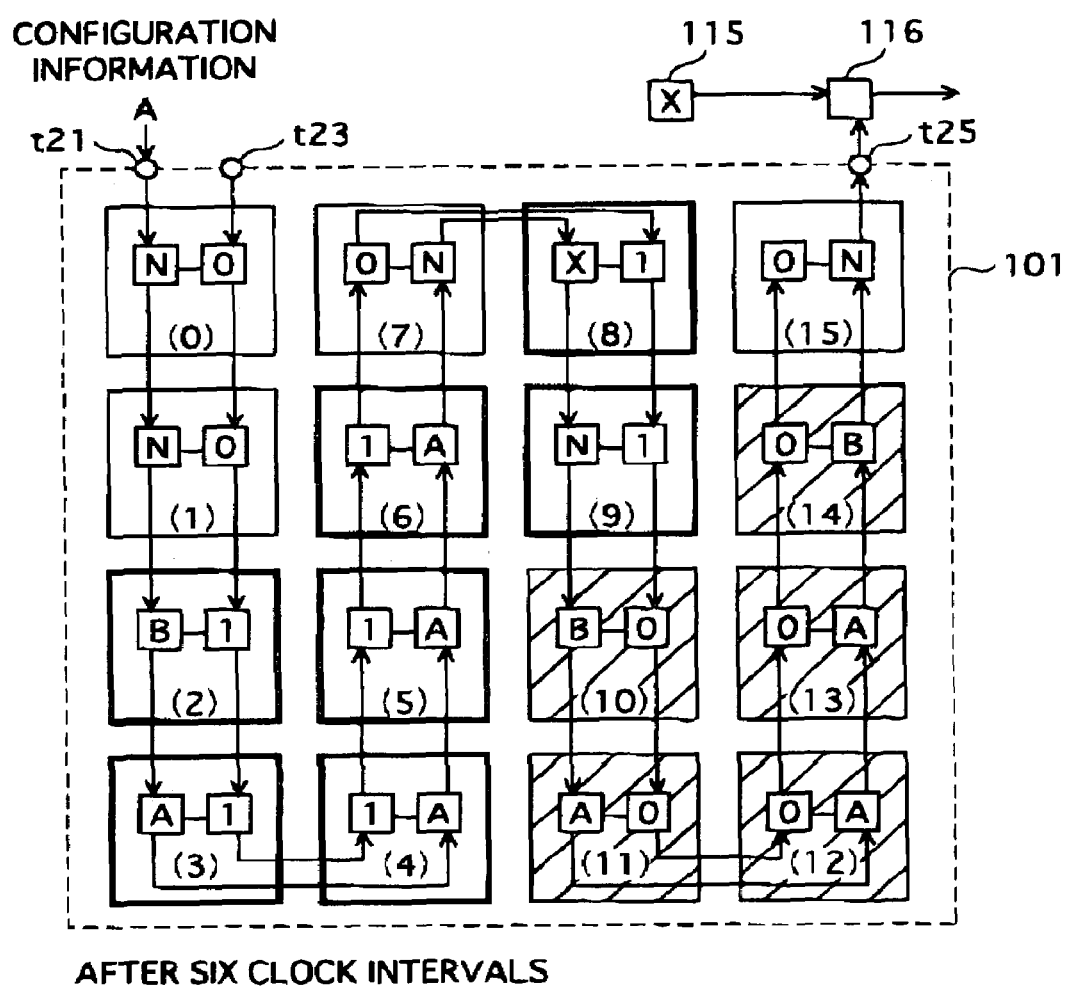
FIG. 11 shows a status of a programmable logic device after six clock intervals.

FIG. 11 shows the status of the programmable logic device 101 after six clock intervals.

After six clock intervals, the predetermined bit pattern "X" is stored in the logic element LE8.

Figure 12:
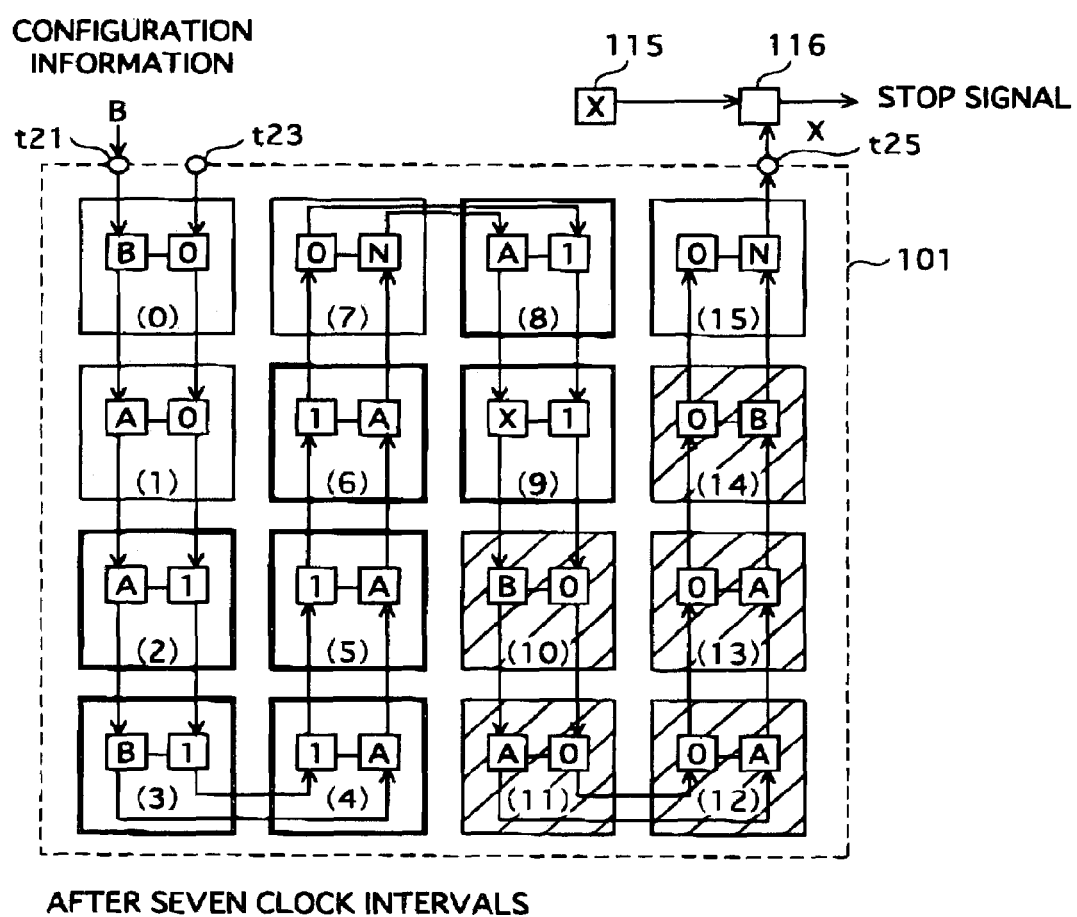
FIG. 12 shows a status of a programmable logic device after seven clock intervals.

FIG. 12 shows the status of the programmable logic device 101 after seven clock intervals.

After seven clock intervals, the predetermined bit pattern "X" is stored in the logic element LE9. After the logic element LE9 stores the predetermined bit pattern "X", the configuration information bypasses the other logic elements. Accordingly, the logic element LE15 outputs the predetermined bit pattern "X" at this point of time.

After the predetermined bit pattern "X" is output, the comparing unit 116 outputs the stop signal.

Figure 13:
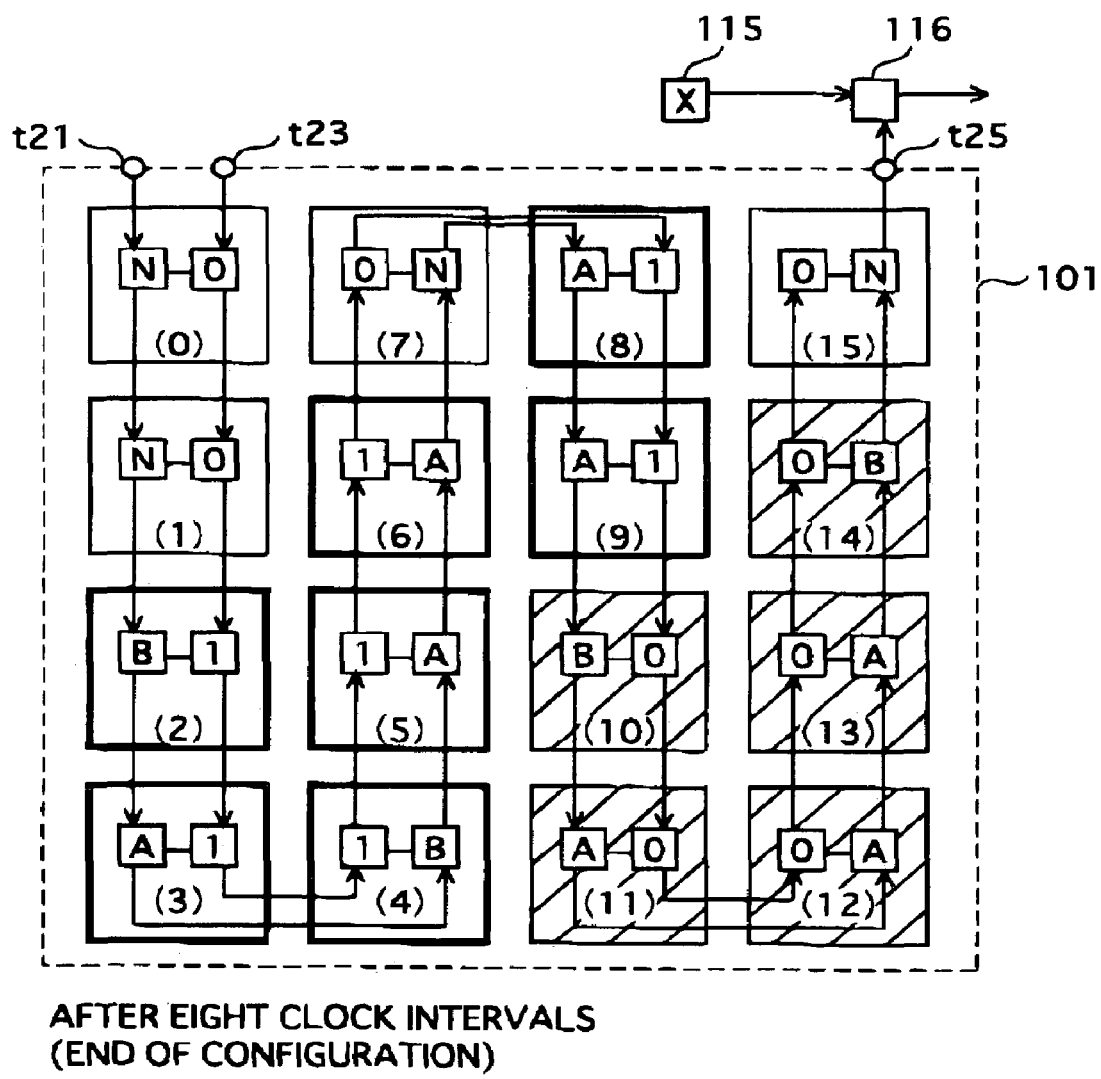
FIG. 13 shows a status of a programmable logic device after eight clock intervals.

FIG. 13 shows the status of the programmable logic device 101 after eight clock intervals.

After eight clock intervals, the configuration information is distributed to every logic element whose function is desired to be changed. The configuration storage control unit 112 stops the input of the configuration information based on the stop signal output by the comparing unit 116 after eight clock intervals.

After that, the configuration apparatus makes all the logic elements store the rewrite information representing a value "0"

The Second Embodiment

Structures

Figure 14:
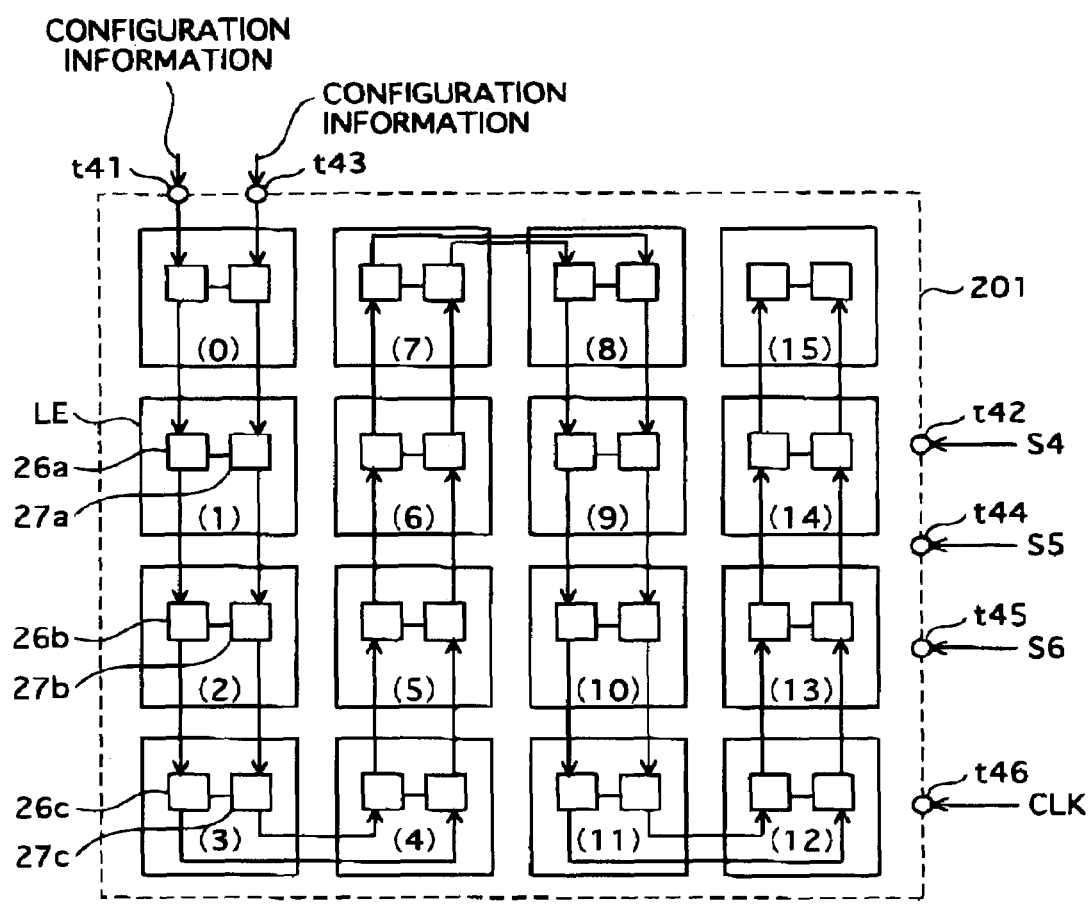
FIG. 14 shows a structure of a programmable logic device according to the second embodiment.

FIG. 14 shows the structure of a programmable logic device according to the second embodiment.

A programmable logic device 201 includes sixteen logic elements (LE). Each logic element includes a unit cell 26 and a unit cell 27. Each unit cell 26 includes a first storing unit 21, and each unit cell 27 includes a second storing unit 23. Each of the first storing unit 21 and the second storing unit 23 stores a piece of configuration information that defines a function of the logic element.

The first storing units respectively included in the logic elements are connected to each other by a cascade connection and structure a shift register. Being independent of this shift register, the second storing units respectively included in the logic elements are also connected to each other by a cascade connection and structure another shift register.

The second embodiment is characterized by that the function of the logic element is defined in advance by a piece of the configuration information stored in one of the first storing unit 21 and the second storing unit 23, and while a piece of the configuration information in one of the storing units 21 and 23 is in use, a piece of the configuration information stored in the other storing unit may be rewritten.

In this embodiment, each of the first storing unit 21 and the second storing unit 23 of the logic element whose function should be changed stores a different piece of the configuration information, and each of the first storing unit 21 and the second storing unit 23 of the logic element in operation stores the same piece of the configuration information. Accordingly, the function of the logic element can be changed when the source of the configuration information is switched to the other one of the first storing unit 21 and the second storing unit 23.

Therefore, the user can change the functions of only intended logic elements without interfering with other logic elements in operation.

A control signals S4, S5 and S6, and the clock signal CLK are input into the programmable logic device 201 via terminals t42, t44, t45 and t46 respectively.

Figure 15:
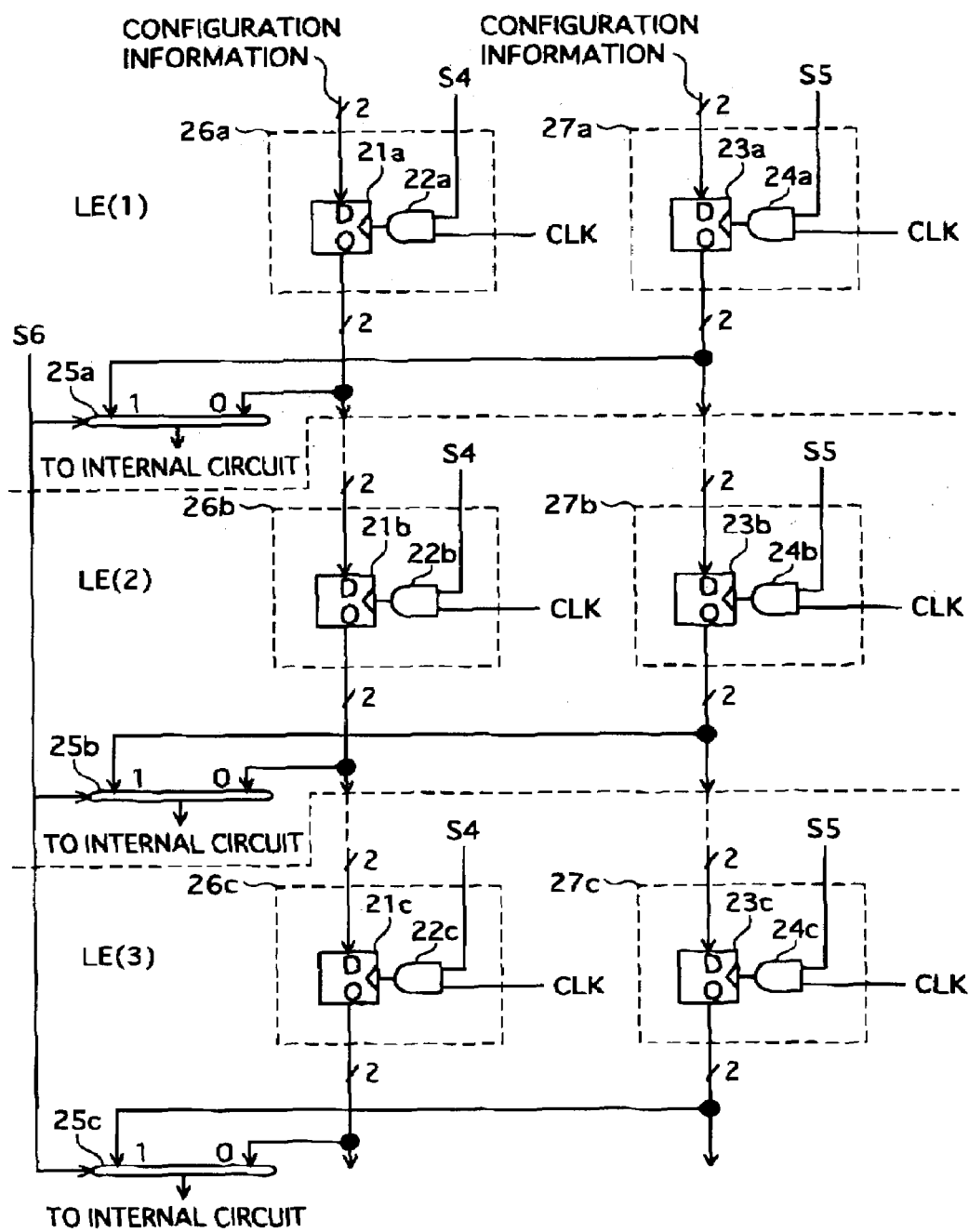
FIG. 15 shows a structure of a logic element according to the second embodiment.

FIG. 15 shows the structure of the logic element according to the second embodiment.

In FIG. 15, only three logic elements (LE1, LE2 and LE3) out of the sixteen logic elements are illustrated. Each logic element has the same structure. Therefore, only the logic element LE2 is described next.

The logic element LE2 includes a first storing unit 21*b*, an AND element 22*b*, a second storing unit 23*b*, an AND element 24*b*, a multiplexer 25*b*, and an internal circuit.

The first storing unit 21*b* and the second storing unit 23*b* are respectively structured by D flip-flops. Here, assume that each piece of the configuration information is 2-bit information.

The output terminal Q of the first storing unit 21*b* is connected to the input terminal D of the first storing unit 21*c*, which is next to the storing unit 21*b*, and also connected to the first input terminal of the multiplexer 25*b*.

The AND element 22*b* performs a logical multiplication on the control signal S4 and the clock signal CLK, and outputs the result of the logical multiplication to the clock terminal of the first storing unit 21*b*.

The output terminal Q of the second storing unit 23*b* is connected to the input terminal D of the second storing unit 23*c*, which is next to the second storing unit 23*b*, and also connected to the second input terminal of the multiplexer 25*b*.

The AND element 24*b* performs a logical multiplication on the control signal S5 and the clock signal CLK, and outputs the result of the logical multiplication to the clock terminal of the second storing unit 23*b*.

The multiplexer 25*b* includes a first input terminal, a second input terminal, an output terminal, and a control terminal. The first input terminal is connected to the output terminal Q of the first storing unit 21*b*, and the second input terminal is connected to the output terminal Q of the second storing unit 23*b*. The output terminal is connected to the internal circuit. A control signal S6 is input to the control terminal. The control signal S6 indicates which configuration information should be output by the multiplexer 25b between the configuration information input to the first input terminal and the configuration information input to the second input terminal.

The internal circuit realizes a function based on a piece of the configuration information given to the internal circuit from the multiplexer 25b.

The following is an example operation of the logic element.

Here, assume that a value "0" is initially set to the control signal S6. Accordingly, the functions of the internal circuits of the logic elements LE1, LE2 and LE3 are respectively defined by the pieces of the configuration information stored in the first storing units 21a, 21b and 21c.

The contents of the second storing units 23a, 23b and 23c are rewritten while the first storing units 21a, 21b and 21c are in operation.

If the control signal S5 represents a value "1", each of the AND elements 24a, 24b and 24c outputs the clock signal CLK. Here, each of the second storing unit 23a, 23b and 23c works as a shift register.

The pieces of the configuration information to be stored by respective logic elements are sequentially input according to the order of the logic elements LE15 to LE0. As a result, each piece of the configuration information is sequentially transferred to the next logic element at each clock interval, and distributed to every logic element after sixteen clock intervals. At this point of time, a value "0" is set to the control signal S5. Then, the shifting operation stops. In this way, the pieces of the configuration information are rewritten.

After the rewriting of the contents of the second storing units 23a, 23b and 23c is finished, a value "1" is set to the control signal S6. Accordingly, the functions of the logic elements LE1, LE2 and LE3 are respectively defined by the pieces of the configuration information stored in the second storing unit 23a, 23b and 23c.

Here, if the piece of the configuration information stored in the second storing unit 23 is identical with the piece of the configuration information stored in the first storing unit 21, the function of the logic element is not changed as defined by the piece of the configuration information stored in the second storing unit 23. If the piece of the configuration information stored in the second storing unit 23 is different from the piece of the configuration information stored in the first storing unit 21, the function of the logic element is changed as defined by the piece of the configuration information stored in the second storing unit 23.

Figure 16:
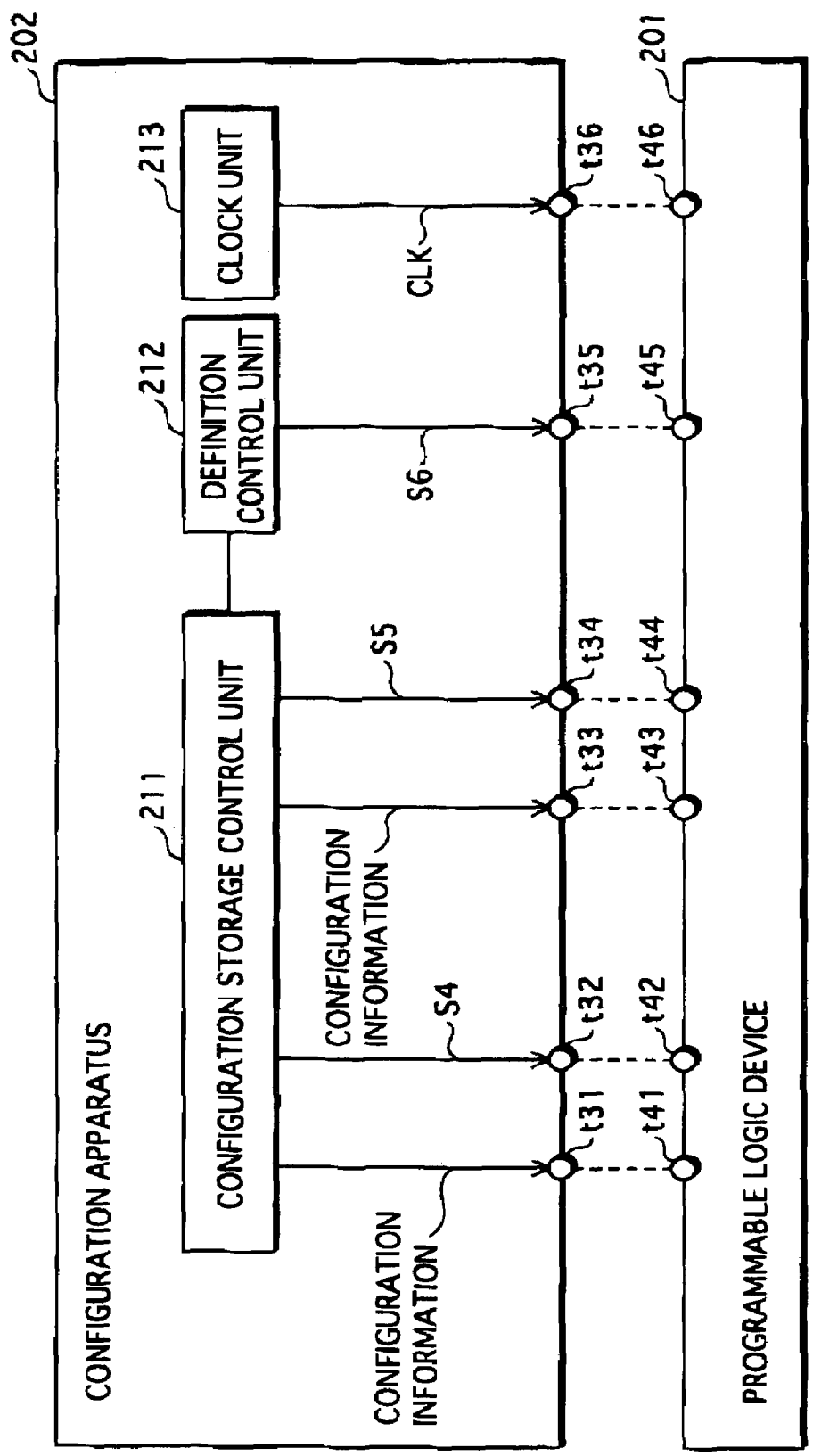
FIG. 16 shows a structure of a configuration apparatus according to the second embodiment.

FIG. 16 shows the structure of the configuration apparatus according to the second embodiment.

A configuration apparatus 202 includes a configuration storage control unit 211, a definition control unit 212, and a clock unit 213.

The configuration storage control unit 211 causes the first storing unit 21 and the second storing unit 23 of each logic element included in the programmable logic device 201 to store the corresponding piece of the configuration information.

More specifically, for rewriting the contents of the first storing unit 21, the configuration storage control unit 211 changes the control signal S4 from "0" to "1", and sequentially outputs, at every clock interval, pieces of the configuration information to the programmable logic device 201. The pieces of the configuration information respectively correspond to the logic elements LE15 to LE0. Then, after sixteen clock intervals, the configuration storage control unit 211 changes the control signal S4 from "1" to "0".

For rewriting the contents of the second storing unit 23, the configuration storage control unit 211 changes the control signal S5 from "0" to "1", and sequentially outputs, at every clock interval, pieces of the configuration information to the programmable logic device 201. The pieces of the configuration information respectively correspond to the logic elements LE15 to LE0. Then, after sixteen clock intervals, the configuration storage control unit 211 changes the control signal S5 from "1" to "0".

The definition control unit 212 sets "0" to the control signal S6 in the case where the function of each logic element should be defined by the contents of the first storage unit 21, and sets "1" to the control signal S6 in the case where the function of each logic element should be defined by the contents of the second storage unit 23.

The clock unit 213 provides the programmable logic device 201 with the clock signal CLK, and also provides each functional unit included in the configuration apparatus 202 with the clock signal CLK.

The Third Embodiment

Structure

Figure 17:
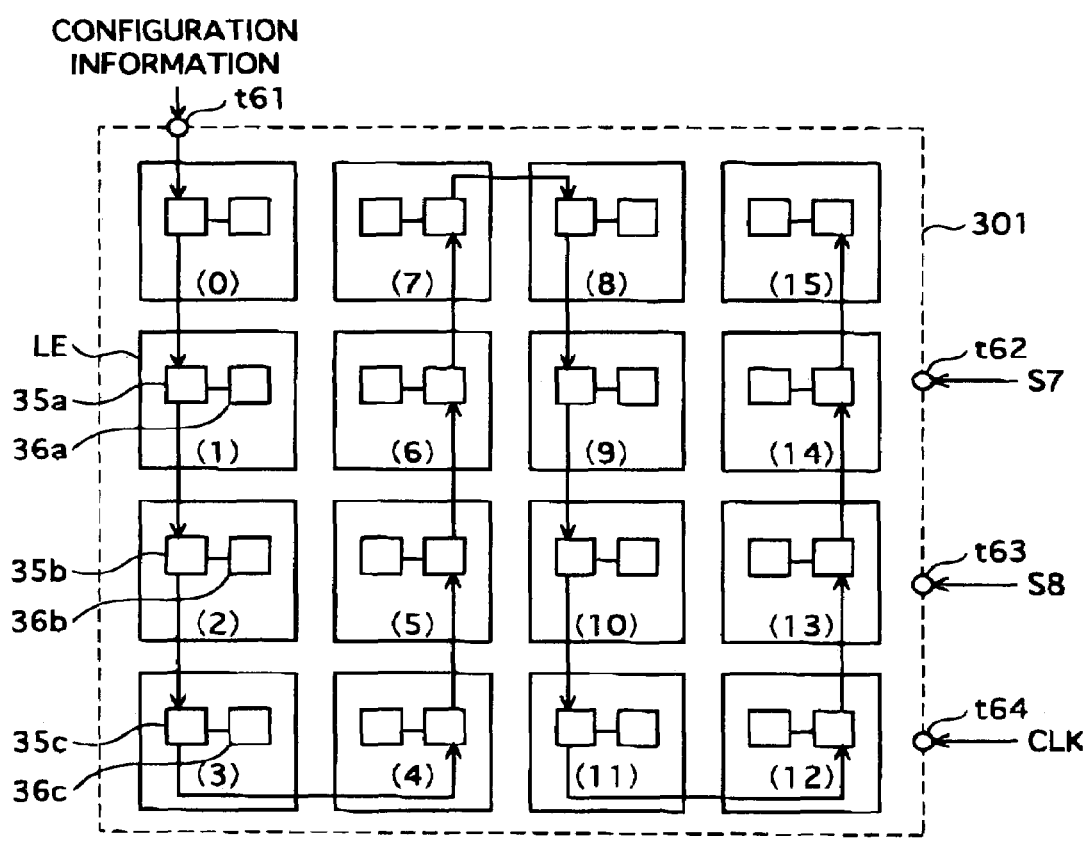
FIG. 17 shows a structure of a programmable logic device according to the third embodiment.

FIG. 17 shows the structure of a programmable logic device according to the third embodiment.

The programmable logic device 301 includes sixteen logic elements (LE). Each logic element includes a unit cell 35 and a unit cell 36. Each unit cell 35 includes a preparatory storing unit 31, and each unit cell 36 includes a main storing unit 33. Each of the preparatory storing unit 31 and the main storing unit 33 stores a piece of configuration information that defines a function of the logic element.

The preparatory storing units respectively included in the logic elements are connected to each other by a cascade connection and structure a shift register.

Each main storing unit 33 stores a piece of the configuration information stored in the preparatory storing unit 31 in accordance with a rewrite instruction.

The third embodiment is characterized by that the main storing unit 33 intervenes between the preparatory storing unit 31 that transmits the configuration information, and the internal circuit of each logic element. Therefore, even if the piece of the configuration information stored in the preparatory storing unit 31 is rewritten, the function of the logic element will not be changed until the rewrite information represents the rewrite permit instruction.

In this embodiment, each of the preparatory storing unit 31 and the main storing unit 33 of the logic element whose function should be changed stores a different piece of the configuration information, and each of the preparatory storing unit 31 and the main storing unit 33 of the logic element in operation stores the same piece of the configuration information. Accordingly, the user can change the function of each logic element by rewriting the piece of the configuration information. Meanwhile, the function of each logic element in operation will not be changed even if the configuration information is changed.

Therefore, the user can change the functions of only intended logic elements without interfering with other logic elements in operation.

A control signals S7 and S8, and the clock signal CLK are input into the programmable logic device 301 via terminals t62, t63 and t64 respectively.

Figure 18:
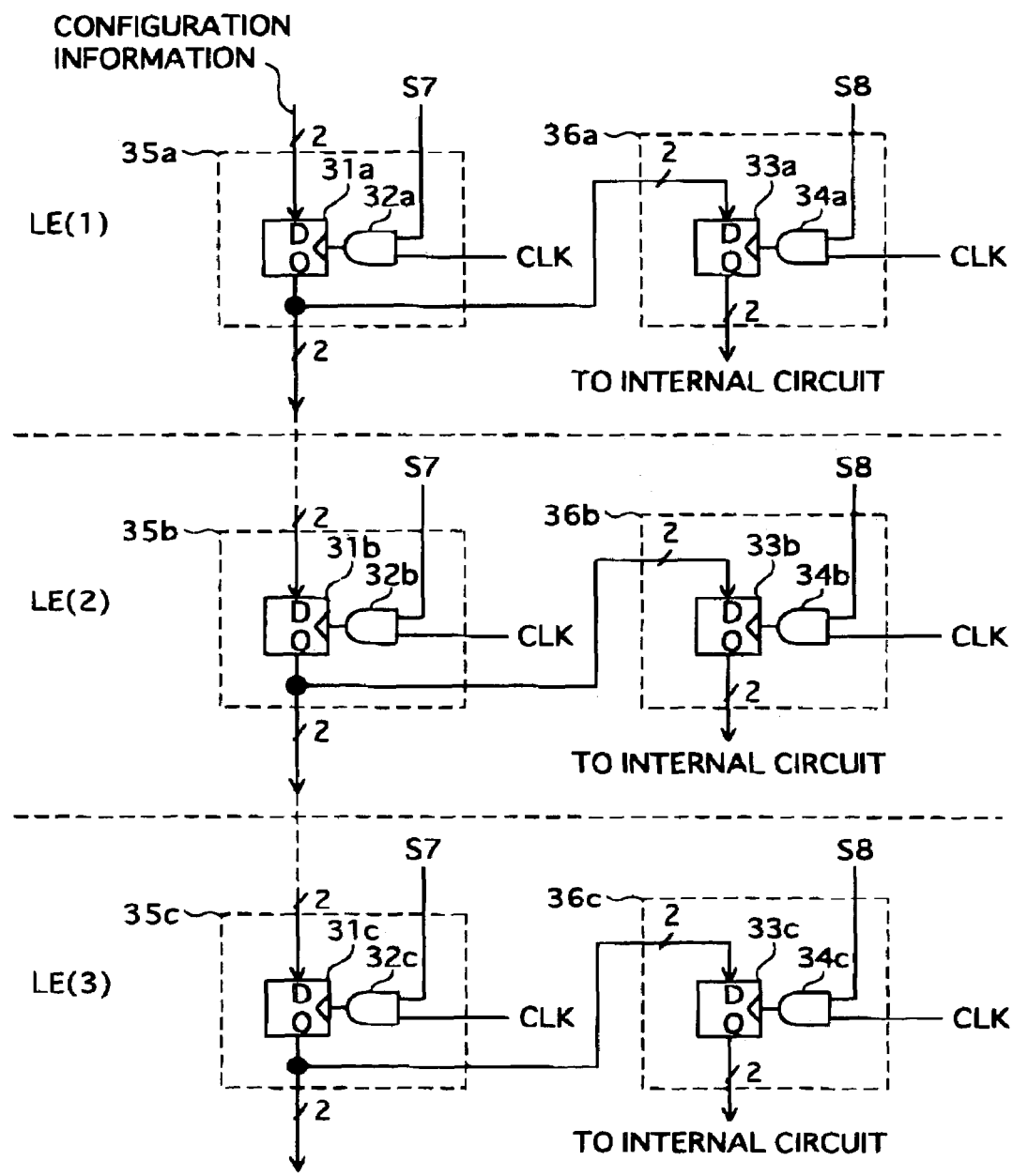
FIG. 18 shows a structure of a logic element according to the third embodiment.

FIG. 18 shows the structure of a logic element according to the third embodiment.

In FIG. 18, only three logic elements (LE1, LE2 and LE3) out of sixteen logic elements are illustrated. Each logic element has the same structure. Therefore, only the logic element LE2 is described next.

The logic element LE2 includes a preparatory storing unit 31b, an AND element 32b, a main storing unit 33b, an AND element 34b, and an internal circuit.

The preparatory storing unit 31b and the main storing unit 33b are respectively structured by D flip-flops. Here, assume that each piece of the configuration information is 2-bit information.

The output terminal Q of the preparatory storing unit 31b is connected to the input terminal D of the preparatory storing unit 31c which is next to the preparatory storing unit 31b, and also connected to the input terminal D of the main storing unit 33b.

The AND element 32b performs a logical multiplication on the control signal S7 and the clock signal CLK, and outputs the result of the logical multiplication to the clock terminal of the preparatory storing unit 31b.

The output terminal Q of the main storing unit 33b is connected to the internal circuit.

The internal circuit realizes a function based on the piece of the configuration information given to the internal circuit from the main storing unit 33b.

The AND element 34b performs a logical multiplication on the control signal S8 and the clock signal CLK, and outputs the result of the logical multiplication to the clock terminal of the main storing unit 33b.

The following is an example operation of the logic element.

The functions of the logic elements LE1, LE2 and LE3 are defined by pieces of configuration information respectively stored in the main storing units 33a, 33b and 33c. In the case that the configuration information should not be rewritten, a value "0" is set to the control signal S8.

The contents of the preparatory storing units 31a, 31b 31c are rewritten while the main storing units 33a, 33b and 33c are in operation.

If the control signal S7 represents a value "1", each of the AND elements 32a, 32b and 32c outputs the clock signal CLK. Here, each of the preparatory storing unit 31a, 31b and 31c works as a shift register.

The pieces of configuration information to be stored in respective preparatory storing units are sequentially input according to the order of the logic element LE15 to LE0. As a result, each piece of the configuration information is sequentially transferred to the next preparatory storing unit at each clock interval, and distributed to every preparatory storing unit after sixteen clock intervals. At this point of time, a value "0" is set to the control signal S7. Then, the shifting operation stops. The pieces of the configuration information are rewritten in this way.

After the rewriting of the contents of the preparatory storing units 31a, 31b and 31c is finished, a value "1" is set as the control signal S8. Accordingly, the pieces of information stored in the main storing units 33a, 33b and 33c are respectively replaced by the pieces of the configuration information stored in the preparatory storing units 31a, 31b and 31c. As a result, the functions of the logic elements LE1, LE2 and LE3 are changed. After that, a value "0" is set to the control signal S8.

Here, if the piece of the configuration information stored in the preparatory storing unit 31 is the same as the piece of the configuration information stored in the main storing unit 33, the function of the logic element is not changed by the main storing unit 33 storing the piece of the configuration information stored in the preparatory storing unit 31. If the piece of the configuration information stored in the preparatory storing unit 31 is different from the piece of the configuration information stored in the main storing unit 33, the function of the logic element is changed as the main storing unit 33 stores the piece of the configuration information stored in the preparatory storing unit 31.

Figure 19:
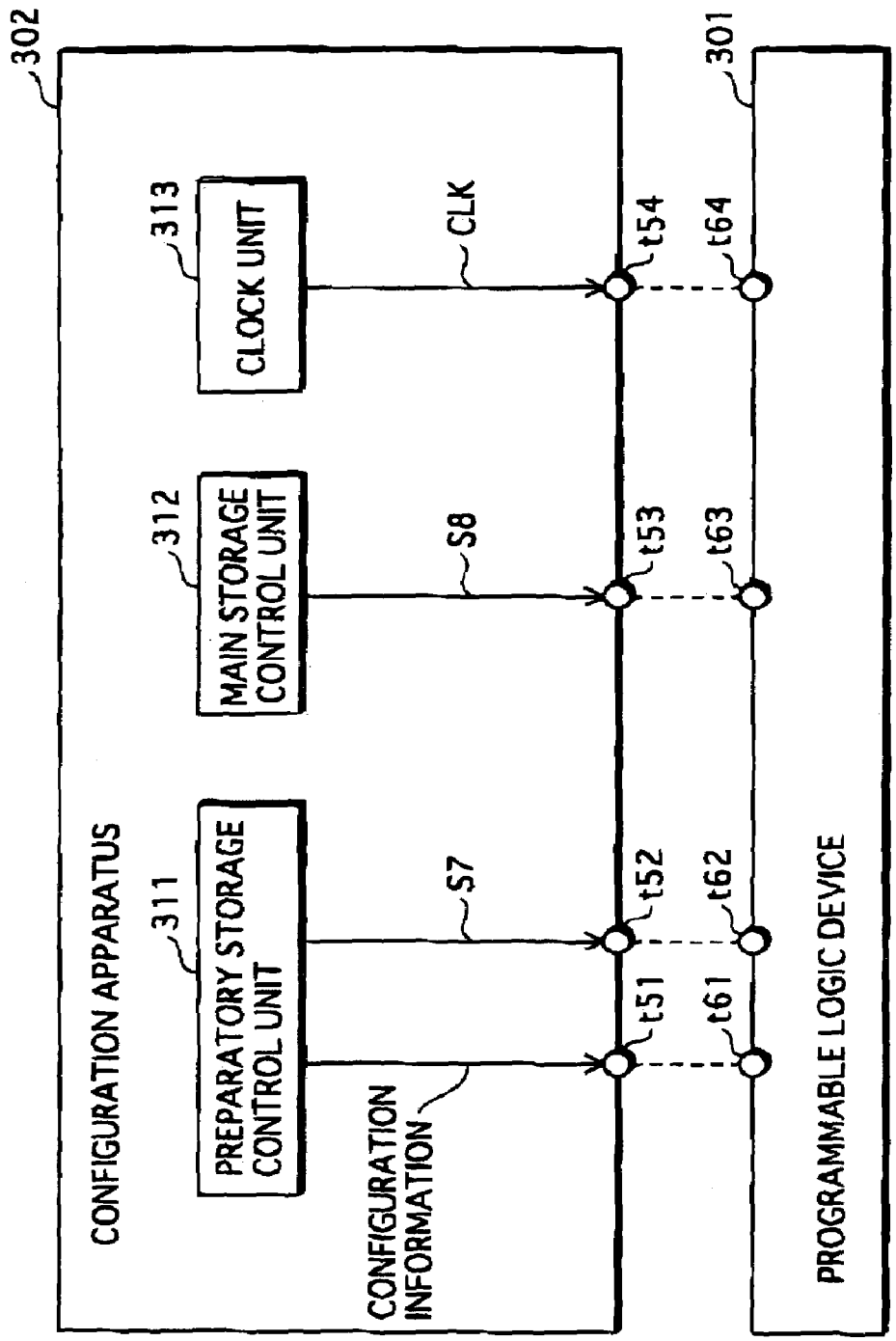
FIG. 19 shows a structure of a configuration apparatus according to the third embodiment.

FIG. 19 shows the structure of a configuration apparatus according to the third embodiment.

A configuration apparatus 302 includes a preparatory storage control unit 311, a main storage control unit 312 and a clock unit 313.

The preparatory storage control unit 311 causes the preparatory storing unit 31 of each logic element included in the programmable logic device 301 to store the corresponding piece of the configuration information.

More specifically, the preparatory storage control unit 311 changes the control signal S7 from "0" to "1", and also sequentially outputs, at every clock interval, pieces of the configuration information to the programmable logic device 301. The pieces of the configuration information respectively correspond to the logic elements LE15 to LE0. Then, after sixteen clock intervals, the preparatory storage control unit 311 changes the control signal S7 from "1" to "0".

In the case where the piece of the configuration information stored in the preparatory storing unit 31 should be rewritten, the main storage control unit 312 sets a value "1" to the control signal S8. In the other cases, the main storage control unit 312 sets a value "0" to the control signal S8.

The clock unit 313 provides the programmable logic device 301 with the clock signal CLK, and also provides each functional unit included in the configuration apparatus 302 with the clock signal CLK.

The programmable logic device according to the present invention, and the configuration apparatus and the configuration method used for the programmable logic device are described above based on the embodiments. However, the present invention is not limited to the embodiments. The following are examples of possible modifications.

(1) In each embodiment, the programmable logic element includes sixteen logic elements. However, the number of the logic elements is not limited to sixteen.

(2) In each embodiment, the configuration information is assumed as two-bit information. However, the present invention is not limited to this. Any number is possible as long as the bits can specify the function realized by the logic element.

(3) In the first embodiment, the configuration information is input after the changing of the rewrite information has finished. However, the present invention is not limited to this. The configuration information may be input at any time as long as the changing of the rewrite information has been finished before the first piece of the configuration information ("X" in the embodiment) reaches at the configuration storing unit whose configuration information should be rewritten.

(4) In the first embodiment, the configuration information of the logic element that is not to be used after the configuration is prohibited to be rewritten. However, the present invention is not limited to this. The configuration information for such a logic element may be rewritten. Further, the NOP may be allocated to such a logic element.

(5) In the first embodiment, the rewrite information storing units correspond to the configuration information storing units on a one-to-one basis. However, the present invention is not limited to this. For instance, a single rewrite information storing unit may give pieces of rewrite information to a plurality of configuration information storing units.

(6) In the first embodiment, the stop unit is installed in the configuration apparatus. However, the present invention is not limited to this. The stop unit may be installed in the programmable logic device.

(7) In the first embodiment, regarding the deliver and the receipt of the configuration information, the logic elements are connected to each other by a cascade connection. However, the present invention is not limited to this. For instance, the logic elements may be connected in a tree structure, a network structure, and so on.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A programmable logic device having one or more logic elements, each logic element comprising:
   a configuration storing unit operable to store therein configuration information;
   an internal circuit operable to perform a function that is based on the configuration information stored in the configuration storing unit;
   a rewrite prohibiting unit operable, if having received a rewrite prohibit instruction, to prohibit replacing of configuration information that has been previously stored in the configuration storing unit with configuration information that is newly input to the logic element; and
   an output unit operable, if having received a rewrite prohibit instruction, to output the newly input configuration information without change, and operable, if having received a rewrite permit instruction, to output configuration information currently stored in the configuration storing unit.

2. The programmable logic device of claim 1, wherein
   the output unit includes a multiplexer having a first input terminal, a second input terminal, a control terminal and an output terminal,
   the first input terminal receives the configuration information currently stored in the configuration storing unit,
   the second input terminal receives the newly input configuration information,
   the control terminal receives rewrite information that represents either the rewrite prohibit instruction or the rewrite permit instruction, and
   the output terminal outputs the configuration information input to the first input terminal if the rewrite information represents the rewrite permit instruction, and outputs the configuration information input to the second input terminal if the rewrite information represents the rewrite prohibit instruction.

3. The programmable logic device of claim 1, wherein
   the programmable logic device has a plurality of the logic elements, and
   all or some of the plurality of the logic elements are connected together by a cascade connection for distributing the configuration information.

4. The programmable logic device of claim 3, further comprising an output terminal, wherein
   the output unit of a logic element at a last stage of the cascade connection, which is included in the plurality of the logic elements, outputs the configuration information to outside the programmable logic device via the output terminal.

5. The programmable logic device of claim 1, further comprising
   a rewrite information storing unit operable to store therein rewrite information that represents either the rewrite prohibit instruction or the rewrite permit instruction, wherein
   each of the rewrite prohibiting unit and the output unit receives the rewrite information.

6. The programmable logic device of claim 5, wherein
   all or some of the plurality of the logic elements are connected together by a cascade connection for distributing the configuration information.

7. The programmable logic device of claim 6, wherein
   the rewrite prohibiting unit prohibits, even if having received the rewrite permit instruction, rewriting of the configuration information that has been previously stored in the configuration storing unit while the rewrite information is being distributed.

8. A programmable logic device having one or more logic elements, each logic element comprising:
   a first storing unit operable to store therein first configuration information;
   a second storing unit operable to store therein second configuration information;
   an internal circuit operable to perform a function that is based on the first configuration information stored in the first storing unit or the second configuration information stored in the second configuration unit;
   a selecting unit operable to select whichever of the first storing unit and the second storing unit stores configuration information that should define the function of the internal circuit; and
   a rewriting unit operable to rewrite the configuration information stored in whichever of the first storing unit and the second storing unit is not selected by the selecting unit.

9. The programmable logic device of claim 8, wherein
   the programmable logic device has a plurality of logic elements,
   all or some of the first storing units of the respective logic elements are connected together by a cascade connection for distributing the first configuration information, and
   all or some of the second storing units of the respective logic elements are connected together by a cascade connection for distributing the second configuration information.

10. A programmable logic device having one or more logic elements, each logic element comprising:
    a main storing unit operable to store therein first configuration information;
    an internal circuit operable to perform a function that is based on the first configuration information stored in the main storing unit;
    a preparatory storing unit operable to store therein second configuration information that is to be transferred to and stored in the main storing unit;
    a main rewriting unit operable, if having received a rewrite permit instruction, to replace the first configuration information stored in the main storing unit with the second configuration information stored in the preparatory configuration information; and a preparatory rewriting unit operable, if having received a rewrite prohibit instruction, to rewrite the second configuration information stored in the preparatory storing unit.

11. The programmable logic device of claim 10, wherein the programmable logic device has a plurality of the logic elements, and the preparatory storing units of the respective logic elements are connected together by a cascade connection for distributing the configuration information.

12. A configuration apparatus that configures a programmable logic device having a plurality of logic elements, each logic element having a same structure including a configuration storing unit, and the configuration apparatus comprising:

a providing unit operable to provide each logic element with a piece of rewrite information which represents either a rewrite permit instruction for permitting rewriting of configuration information or a rewrite prohibit instruction for prohibiting the rewriting; and a configuration information input unit operable to input, to the programmable logic device, a piece of configuration information in correspondence with a logic element included in the plurality of the logic elements to which the piece of the rewrite information that represents the rewrite permit instruction is provided by the providing unit.

13. The configuration apparatus of claim 12, wherein the plurality of the logic elements are connected together by a cascade connection for distributing the configuration information, and the configuration information input unit arranges pieces of the configuration information in accordance with an order of the logic elements, and sequentially inputs the pieces of the configuration information to a logic element at a first stage of the cascade connection, which is included in the plurality of the logic elements.

14. The configuration apparatus of claim 13, wherein a logic element at a last stage of the cascade connection, which is included in the plurality of the logic elements, outputs the configuration information to outside the programmable logic device, and the configuration apparatus further comprising:

a predetermined pattern input unit operable to input a predetermined bit pattern to the logic element at the first stage of the cascade connection before the configuration information input unit inputs the configuration information; and a stop unit operable to stop the configuration information input unit after the predetermined bit pattern is output from the logic element at the last stage of the cascade connection.

15. A configuration apparatus that configures a programmable logic device having a plurality of logic elements, each logic element having a same structure including a first storing unit and a second storing unit, and the configuration apparatus comprising:

a first input unit operable to input pieces of first configuration information in one-to-one correspondence with the logic elements to the first storing units of the respective logic elements;

a second input unit operable to input pieces of second configuration information in one-to-one correspondence with the logic elements into the second storing units of the respective logic elements; and a providing unit operable to provide each logic element with a control signal that indicates which between the first configuration information and the second configuration information should be selected.

16. The configuration apparatus of claim 15, wherein the plurality of the logic elements are connected together by a cascade connection for distributing the first configuration information and the second configuration information, the first input unit arranges pieces of the first configuration information in accordance with an order of the logic elements, and sequentially inputs the pieces of the first configuration information to a logic element at a first stage of the cascade connection, which is included in the plurality of the logic elements, and the second input unit arranges pieces of the second configuration information in accordance with an order of the logic elements, and sequentially inputs the pieces of the second configuration information to the logic element at the first stage of the cascade connection.

17. A configuration apparatus that configures a programmable logic device having a plurality of logic elements, each logic element having a same structure including a preparatory storing unit and a main storing unit, and the configuration apparatus comprising:

an input unit operable to input pieces of first configuration information that are in one-to-one correspondence with the logic elements and are to be transferred to and stored in the main storing units of the respective logic elements; and a providing unit operable to provide each logic element with a control signal indicating that the first configuration information stored in the main storing unit should be replaced by second configuration information stored in the preparatory storing unit.

18. The configuration apparatus of claim 17, wherein the plurality of the logic elements are connected together by a cascade connection for distributing the configuration information, and the input unit arranges the pieces of the configuration information in accordance with an order of the logic elements, and sequentially inputs the pieces of the configuration information to a logic element at a first stage of the cascade connection, which is included in the plurality of the logic elements.

19. A configuration method for configuring a programmable logic device having a plurality of logic elements, each logic element having a same structure including a configuration storing unit, and the configuration method comprising:

a providing step of providing each logic element with a rewrite permit instruction for permitting rewriting of configuration information or a rewrite prohibit instruction for prohibiting the rewriting; and an input step of inputting, to the programmable logic device, a piece of the configuration information in correspondence with a logic element included in the plurality of the logic elements to which the rewrite permit instruction is provided by the providing step.

20. A configuration method for configuring a programmable logic device having a plurality of logic elements, each logic element having a same structure including a first storing unit and a second storing unit, and the configuration method comprising:
- a first input step of inputting pieces of first configuration information in one-to-one correspondence with the logic elements into the first storing units of the respective logic elements;
- a providing step of providing each logic element with a control signal indicating that the first configuration information stored in the first storing unit of each logic element should be selected; and
- a second input step of inputting pieces of second configuration information in one-to-one correspondence with the logic elements into the second storing units of the respective logic elements while the first configuration information is being selected in accordance with the providing step.

21. A configuration method for configuring a programmable logic device having a plurality of logic elements, each logic element having a same structure including a preparatory storing unit and a main storing unit, and the configuration method comprising:
- an input step of inputting pieces of first configuration information that are in one-to-one correspondence with the logic elements and are to be transferred to and stored in the main storing units of the respective logic elements; and
- a providing step of providing each logic element with a control signal indicating that the first configuration information stored in the main storing unit should be replaced by the second configuration information stored in the preparatory storing unit.

* * * * *